US 12,506,114 B2

United States Patent
Uzoh

(10) Patent No.: US 12,506,114 B2
(45) Date of Patent: Dec. 23, 2025

(54) DIRECTLY BONDED METAL STRUCTURES HAVING ALUMINUM FEATURES AND METHODS OF PREPARING SAME

(71) Applicant: ADEIA SEMICONDUCTOR BONDING TECHNOLOGIES INC., San Jose, CA (US)

(72) Inventor: Cyprian Emeka Uzoh, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 407 days.

(21) Appl. No.: 18/148,332

(22) Filed: Dec. 29, 2022

(65) Prior Publication Data

US 2024/0222315 A1    Jul. 4, 2024

(51) Int. Cl.
*H01L 23/48*    (2006.01)
*H01L 23/00*    (2006.01)
(Continued)

(52) U.S. Cl.
CPC ............. *H01L 24/80* (2013.01); *H01L 24/03* (2013.01); *H01L 24/05* (2013.01); *H01L 24/08* (2013.01);
(Continued)

(58) Field of Classification Search
CPC ............ H01L 24/80; H01L 24/08; H01L 2224/08225; H01L 2224/80006;
(Continued)

(56) References Cited

U.S. PATENT DOCUMENTS

| | | |
|---|---|---|
| 4,939,568 A | 7/1990 | Kato et al. |
| 4,998,665 A | 3/1991 | Hayashi |

(Continued)

FOREIGN PATENT DOCUMENTS

| | | |
|---|---|---|
| CN | 1112286 A | 11/1995 |
| CN | 103531492 A | 1/2014 |

(Continued)

OTHER PUBLICATIONS

Akolkar, R., "Current status and advances in Damascene Electrodeposition," Encyclopedia of Interfacial Chemistry: Surface Science and Electrochemistry, 2017, 8 pages.

(Continued)

*Primary Examiner* — Niki H Nguyen
(74) *Attorney, Agent, or Firm* — Knobbe, Martens, Olson & Bear, LLP

(57) ABSTRACT

An element, a bonded structure including the element, and a method of forming the same are disclosed. The bonded structure can include a first element having a first nonconductive field region and a first conductive feature. A surface of the first nonconductive field region and a surface of the first conductive feature at least partially defining a bonding surface of the first element. The first conductive feature includes a first portion and a second portion over the first portion and at least partially defines the surface of the first conductive feature. The first portion includes aluminum. The first conductive feature has a continuous sidewall along the first portion and the second portion. The second portion includes different metal composition from the first portion or comprising fluorine at the surface of the first conductive feature. The bonded structure can include a second element having a second nonconductive field region and a second conductive feature. A surface of the second nonconductive field region is directly bonded to the first nonconductive (Continued)

field region without an intervening adhesive along a bond interface and a surface of the second conductive feature is directly bonded to the second conductive feature without an intervening adhesive along the bond interface.

51 Claims, 14 Drawing Sheets

(51) Int. Cl.
*H01L 23/52* (2006.01)
*H01L 29/40* (2006.01)

(52) U.S. Cl.
CPC ...... *H01L 24/94* (2013.01); *H01L 2224/0345* (2013.01); *H01L 2224/03614* (2013.01); *H01L 2224/05073* (2013.01); *H01L 2224/05082* (2013.01); *H01L 2224/05124* (2013.01); *H01L 2224/05166* (2013.01); *H01L 2224/05184* (2013.01); *H01L 2224/05186* (2013.01); *H01L 2224/05571* (2013.01); *H01L 2224/05624* (2013.01); *H01L 2224/05647* (2013.01); *H01L 2224/08145* (2013.01); *H01L 2224/8002* (2013.01); *H01L 2224/80357* (2013.01); *H01L 2224/80895* (2013.01); *H01L 2224/80896* (2013.01); *H01L 2224/80906* (2013.01); *H01L 2224/94* (2013.01); *H01L 2924/04941* (2013.01)

(58) Field of Classification Search
CPC . H01L 2224/80895; H01L 2224/80896; H01L 24/05; H01L 2224/0603; H01L 2924/15311; H01L 2224/16227; H01L 25/0657; H01L 25/0753; H01L 24/06; H01L 2224/32145; H01L 2224/48472; H01L 2224/73253; H01L 2224/83801; H01L 2224/16145; H01L 2225/06513; H01L 24/33; H01L 2924/351; H01L 2224/08145; H01L 2225/06517; H01L 21/4846; H01L 21/568; H01L 2224/81801; H01L 23/142; H01L 2224/12105; H01L 2224/32227
See application file for complete search history.

(56) References Cited

U.S. PATENT DOCUMENTS

| | | | |
|---|---|---|---|
| 5,087,585 A | 2/1992 | Hayashi | |
| 5,236,118 A | 8/1993 | Bower et al. | |
| 5,322,593 A | 6/1994 | Hasegawa et al. | |
| 5,413,952 A | 5/1995 | Pages et al. | |
| 5,421,953 A | 6/1995 | Nagakubo et al. | |
| 5,442,235 A | 8/1995 | Parrillo et al. | |
| 5,489,804 A | 2/1996 | Pasch | |
| 5,501,003 A | 3/1996 | Bernstein | |
| 5,503,704 A | 4/1996 | Bower et al. | |
| 5,516,727 A | 5/1996 | Broom | |
| 5,610,431 A | 3/1997 | Martin | |
| 5,734,199 A | 3/1998 | Kawakita et al. | |
| 5,753,536 A | 5/1998 | Sugiyama et al. | |
| 5,771,555 A | 6/1998 | Eda et al. | |
| 5,821,692 A | 10/1998 | Rogers et al. | |
| 5,866,942 A | 2/1999 | Suzuki et al. | |
| 5,904,860 A | 5/1999 | Nagakubo et al. | |
| 5,985,739 A | 11/1999 | Plettner et al. | |
| 5,998,808 A | 12/1999 | Matsushita | |
| 6,008,126 A | 12/1999 | Leedy | |
| 6,063,968 A | 5/2000 | Hubner et al. | |
| 6,071,761 A | 6/2000 | Jacobs | |
| 6,080,640 A | 6/2000 | Gardner et al. | |
| 6,097,096 A | 8/2000 | Gardner et al. | |
| 6,117,784 A | 9/2000 | Uzoh | |
| 6,123,825 A | 9/2000 | Uzoh et al. | |
| 6,147,000 A | 11/2000 | You et al. | |
| 6,232,150 B1 | 5/2001 | Lin et al. | |
| 6,258,625 B1 | 7/2001 | Brofman et al. | |
| 6,259,160 B1 | 7/2001 | Lopatin et al. | |
| 6,265,775 B1 | 7/2001 | Seyyedy | |
| 6,297,072 B1 | 10/2001 | Tilmans et al. | |
| 6,316,786 B1 | 11/2001 | Mueller et al. | |
| 6,333,120 B1 | 12/2001 | DeHaven et al. | |
| 6,333,206 B1 | 12/2001 | Ito et al. | |
| 6,348,709 B1 | 2/2002 | Graettinger et al. | |
| 6,374,770 B1 | 4/2002 | Lee | |
| 6,409,904 B1 | 6/2002 | Uzoh et al. | |
| 6,423,640 B1 | 7/2002 | Lee et al. | |
| 6,433,402 B1 | 8/2002 | Wo et al. | |
| 6,465,892 B1 | 10/2002 | Suga | |
| 6,528,894 B1 | 3/2003 | Akram et al. | |
| 6,552,436 B2 | 4/2003 | Burnette et al. | |
| 6,555,917 B1 | 4/2003 | Heo | |
| 6,579,744 B1 | 6/2003 | Jiang | |
| 6,583,515 B1 | 6/2003 | James et al. | |
| 6,589,813 B1 | 7/2003 | Park | |
| 6,600,224 B1 | 7/2003 | Farquhar et al. | |
| 6,624,003 B1 | 9/2003 | Rice | |
| 6,627,814 B1 | 9/2003 | Stark | |
| 6,632,377 B1 | 10/2003 | Brusic et al. | |
| 6,660,564 B2 | 12/2003 | Brady | |
| 6,667,225 B2 | 12/2003 | Hau-Riege et al. | |
| 6,758,388 B1 | 7/2004 | Leholm et al. | |
| 6,828,686 B2 | 12/2004 | Park | |
| 6,837,979 B2 | 1/2005 | Uzoh et al. | |
| 6,864,585 B2 | 3/2005 | Enquist | |
| 6,887,769 B2 | 5/2005 | Kellar et al. | |
| 6,902,987 B1 | 6/2005 | Tong et al. | |
| 6,908,027 B2 | 6/2005 | Tolchinsky et al. | |
| 6,909,194 B2 | 6/2005 | Farnworth et al. | |
| 6,962,835 B2 | 11/2005 | Tong et al. | |
| 6,974,769 B2 | 12/2005 | Basol et al. | |
| 7,045,453 B2 | 5/2006 | Canaperi et al. | |
| 7,078,811 B2 | 7/2006 | Suga | |
| 7,105,980 B2 | 9/2006 | Abbott et al. | |
| 7,109,063 B2 | 9/2006 | Jiang | |
| 7,126,212 B2 | 10/2006 | Enquist et al. | |
| 7,193,423 B1 | 3/2007 | Dalton et al. | |
| 7,238,919 B2 | 7/2007 | Kaneko et al. | |
| 7,354,798 B2 | 4/2008 | Pogge et al. | |
| 7,485,968 B2 | 2/2009 | Enquist et al. | |
| 7,750,488 B2 | 7/2010 | Patti et al. | |
| 7,803,693 B2 | 9/2010 | Trezza | |
| 7,998,335 B2 | 8/2011 | Feeney et al. | |
| 8,039,966 B2 | 10/2011 | Yang et al. | |
| 8,101,858 B2 | 1/2012 | Hannour et al. | |
| 8,168,532 B2 | 5/2012 | Haneda et al. | |
| 8,183,127 B2 | 5/2012 | Patti et al. | |
| 8,241,961 B2 | 8/2012 | Kim et al. | |
| 8,242,600 B2 | 8/2012 | Yang et al. | |
| 8,314,007 B2 | 11/2012 | Vaufredaz | |
| 8,349,635 B1 | 1/2013 | Gan et al. | |
| 8,377,798 B2 | 2/2013 | Peng et al. | |
| 8,435,421 B2 | 5/2013 | Keleher et al. | |
| 8,441,131 B2 | 5/2013 | Ryan | |
| 8,476,146 B2 | 7/2013 | Chen et al. | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,728,934 B2 | 5/2014 | Uzho et al. | |
| 8,802,538 B1 | 8/2014 | Liu | |
| 8,809,123 B2 | 8/2014 | Liu et al. | |
| 8,841,002 B2 | 9/2014 | Tong | |
| 8,988,299 B2 | 3/2015 | Kam et al. | |
| 9,000,600 B2 | 4/2015 | Uzoh et al. | |
| 9,028,755 B2 | 5/2015 | Itoh | |
| 9,093,350 B2 | 7/2015 | Endo et al. | |

(56) References Cited

U.S. PATENT DOCUMENTS

| | | | |
|---|---|---|---|
| 9,123,703 B2 | 9/2015 | Uzoh et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,190,345 B1 * | 11/2015 | Chen .................... H01L 24/08 |
| 9,190,375 B2 | 11/2015 | Ayotte et al. |
| 9,224,704 B2 | 12/2015 | Landru |
| 9,230,941 B2 | 1/2016 | Chen et al. |
| 9,257,399 B2 | 2/2016 | Kuang et al. |
| 9,269,612 B2 | 2/2016 | Chen et al. |
| 9,299,736 B2 | 3/2016 | Chen et al. |
| 9,312,229 B2 | 4/2016 | Chen et al. |
| 9,318,385 B2 | 4/2016 | Uzoh et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,349,669 B2 | 5/2016 | Uzoh et al. |
| 9,368,866 B2 | 6/2016 | Yu |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,433,093 B2 | 8/2016 | Uzoh |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,633,971 B2 | 4/2017 | Uzoh |
| 9,656,852 B2 | 5/2017 | Cheng et al. |
| 9,666,573 B1 | 5/2017 | Sukekawa |
| 9,723,716 B2 | 8/2017 | Meinhold |
| 9,728,521 B2 | 8/2017 | Tsai et al. |
| 9,741,620 B2 | 8/2017 | Uzoh et al. |
| 9,776,270 B2 | 10/2017 | Ayotte et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,147,641 B2 | 12/2018 | Enquist et al. |
| 10,204,893 B2 | 2/2019 | Uzoh et al. |
| 10,262,963 B2 | 4/2019 | Enquist |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,314,175 B2 | 6/2019 | Sato et al. |
| 10,418,277 B2 | 9/2019 | Cheng et al. |
| 10,434,749 B2 | 10/2019 | Tong et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,515,913 B2 | 12/2019 | Katkar et al. |
| 10,522,499 B2 | 12/2019 | Enquist et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,908,173 B2 | 2/2021 | Yamasaki et al. |
| 10,923,408 B2 | 2/2021 | Huang et al. |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,515,279 B2 | 11/2022 | Uzoh et al. |
| 11,769,747 B2 | 9/2023 | Sawada et al. |
| 11,908,739 B2 | 2/2024 | Uzoh |
| 12,046,571 B2 | 7/2024 | Uzoh et al. |
| 12,100,676 B2 | 9/2024 | Uzoh et al. |
| 12,132,020 B2 | 10/2024 | Uzoh et al. |
| 12,154,880 B2 | 11/2024 | Uzoh |
| 2002/0000328 A1 | 1/2002 | Motomura et al. |
| 2002/0003307 A1 | 1/2002 | Suga |
| 2002/0025665 A1 | 2/2002 | Juengling |
| 2002/0047208 A1 | 4/2002 | Uzoh et al. |
| 2002/0074670 A1 | 6/2002 | Suga |
| 2002/0094661 A1 | 7/2002 | Enquist et al. |
| 2003/0092220 A1 | 5/2003 | Akram |
| 2003/0157748 A1 | 8/2003 | Kim et al. |
| 2004/0052390 A1 | 3/2004 | Morales et al. |
| 2004/0052930 A1 | 3/2004 | Basol et al. |
| 2004/0084414 A1 | 5/2004 | Sakai et al. |
| 2004/0238492 A1 | 12/2004 | Catabay et al. |
| 2006/0024950 A1 | 2/2006 | Choi et al. |
| 2006/0057945 A1 | 3/2006 | Hsu et al. |
| 2006/0220197 A1 | 10/2006 | Kobrinsky et al. |
| 2007/0096294 A1 | 5/2007 | Ikeda et al. |
| 2007/0111386 A1 | 5/2007 | Kim et al. |
| 2008/0073795 A1 | 3/2008 | Kohl et al. |
| 2008/0122092 A1 | 5/2008 | Hong |
| 2008/0237053 A1 | 10/2008 | Andricacos et al. |
| 2009/0197408 A1 | 8/2009 | Lehr et al. |
| 2009/0200668 A1 | 8/2009 | Yang et al. |
| 2010/0255262 A1 | 10/2010 | Chen et al. |
| 2010/0327443 A1 | 12/2010 | Kim |
| 2011/0074040 A1 | 3/2011 | Frank et al. |
| 2011/0076787 A1 | 3/2011 | Ahmad et al. |
| 2011/0084403 A1 | 4/2011 | Yang et al. |
| 2012/0211894 A1 | 8/2012 | Aoyagi |
| 2012/0212384 A1 | 8/2012 | Kam et al. |
| 2013/0009321 A1 | 1/2013 | Kagawa et al. |
| 2013/0020704 A1 | 1/2013 | Sadaka |
| 2013/0221527 A1 | 8/2013 | Yang et al. |
| 2013/0252399 A1 | 9/2013 | Leduc |
| 2014/0153210 A1 | 6/2014 | Uzoh |
| 2014/0175655 A1 | 6/2014 | Chen et al. |
| 2014/0191418 A1 | 7/2014 | Cheng et al. |
| 2014/0225258 A1 | 8/2014 | Chiu et al. |
| 2014/0225795 A1 | 8/2014 | Yu |
| 2014/0252635 A1 | 9/2014 | Tran et al. |
| 2014/0264948 A1 | 9/2014 | Chou et al. |
| 2014/0353828 A1 | 12/2014 | Edelstein et al. |
| 2015/0064498 A1 | 3/2015 | Tong |
| 2015/0108644 A1 | 4/2015 | Kuang et al. |
| 2015/0206823 A1 | 7/2015 | Lin et al. |
| 2015/0206840 A1 | 7/2015 | Lin et al. |
| 2015/0279888 A1 | 10/2015 | Chen et al. |

(56) References Cited

U.S. PATENT DOCUMENTS

| | | |
|---|---|---|
| 2015/0340269 A1 | 11/2015 | Rivoire et al. |
| 2015/0364434 A1 | 12/2015 | Chen et al. |
| 2015/0380368 A1 | 12/2015 | Momose et al. |
| 2016/0020183 A1 | 1/2016 | Chuang et al. |
| 2016/0133598 A1 | 5/2016 | Baudin et al. |
| 2016/0276383 A1 | 9/2016 | Chuang et al. |
| 2016/0343682 A1 | 11/2016 | Kawasaki |
| 2017/0025381 A1 | 1/2017 | Tsai et al. |
| 2017/0047307 A1 | 2/2017 | Uzoh |
| 2017/0062366 A1* | 3/2017 | Enquist ............... H01L 24/05 |
| 2017/0069575 A1 | 3/2017 | Haba et al. |
| 2017/0086320 A1 | 3/2017 | Barber |
| 2017/0141079 A1 | 5/2017 | Kao et al. |
| 2017/0194271 A1 | 7/2017 | Hsu et al. |
| 2017/0271242 A1 | 9/2017 | Lo et al. |
| 2017/0330855 A1 | 11/2017 | Tung et al. |
| 2017/0355040 A1 | 12/2017 | Utsumi et al. |
| 2018/0151523 A1 | 5/2018 | Chen et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0273377 A1 | 9/2018 | Katkar et al. |
| 2018/0295718 A1 | 10/2018 | Uzoh et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0350674 A1 | 12/2018 | Uzoh |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0244909 A1 | 8/2019 | Chiu et al. |
| 2019/0265411 A1 | 8/2019 | Huang et al. |
| 2019/0295954 A1 | 9/2019 | Nomura et al. |
| 2019/0319007 A1 | 10/2019 | Uzoh et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2019/0393086 A1* | 12/2019 | Uzoh ............... H01L 21/76883 |
| 2020/0006280 A1 | 1/2020 | Shah et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0098711 A1 | 3/2020 | Choi et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0258857 A1 | 8/2020 | Huo et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0381389 A1 | 12/2020 | Uzoh et al. |
| 2020/0395321 A1 | 12/2020 | Katkar et al. |
| 2020/0411483 A1 | 12/2020 | Uzoh et al. |
| 2021/0028136 A1 | 1/2021 | Said et al. |
| 2021/0028144 A1 | 1/2021 | Lu |
| 2021/0098359 A1 | 4/2021 | Vreeland et al. |
| 2021/0098411 A1 | 4/2021 | Liff et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0234070 A1 | 7/2021 | Brueck et al. |
| 2021/0242050 A1 | 8/2021 | Chiu |
| 2021/0242152 A1 | 8/2021 | Fountain, Jr. et al. |
| 2021/0257333 A1 | 8/2021 | Yan |
| 2021/0296282 A1 | 9/2021 | Gao et al. |
| 2021/0305202 A1 | 9/2021 | Uzoh et al. |
| 2021/0335737 A1 | 10/2021 | Katkar et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0130787 A1 | 4/2022 | Uzoh |
| 2022/0139867 A1 | 5/2022 | Uzoh |
| 2022/0139869 A1 | 5/2022 | Gao et al. |
| 2022/0139975 A1 | 5/2022 | Kimura et al. |
| 2022/0149002 A1 | 5/2022 | Hou et al. |
| 2022/0157752 A1 | 5/2022 | Bourjot et al. |
| 2022/0165692 A1 | 5/2022 | Uzoh et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005849 A1 | 1/2023 | Chuang |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0120352 A1 | 4/2023 | Lien et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman et al. |
| 2024/0079376 A1 | 3/2024 | Suwito et al. |
| 2024/0105674 A1 | 3/2024 | Uzoh et al. |
| 2024/0113059 A1 | 4/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |

(56) References Cited

U.S. PATENT DOCUMENTS

| | | |
|---|---|---|
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0022752 A1 | 1/2025 | Uzoh |
| 2025/0054854 A1 | 2/2025 | Katkar et al. |
| 2025/0079364 A1 | 3/2025 | Uzoh et al. |
| 2025/0087616 A1 | 3/2025 | Uzoh |
| 2025/0096172 A1 | 3/2025 | Uzoh et al. |
| 2025/0096191 A1 | 3/2025 | Gao et al. |
| 2025/0112123 A1 | 4/2025 | Katkar et al. |
| 2025/0185163 A1 | 6/2025 | Zhao et al. |
| 2025/0210585 A1 | 6/2025 | Fountain, Jr. et al. |
| 2025/0212554 A1 | 6/2025 | Katkar et al. |
| 2025/0218903 A1 | 7/2025 | Uzoh et al. |

FOREIGN PATENT DOCUMENTS

| | | |
|---|---|---|
| CN | 106711131 A | 5/2017 |
| CN | 107256852 B | 9/2019 |
| JP | 2000-183061 | 6/2000 |
| JP | 2002-353416 A | 12/2002 |
| JP | 2013-033786 A | 2/2013 |
| JP | 2016-21497 A | 2/2016 |
| JP | 2018-129475 | 8/2018 |
| JP | 2018-160519 | 10/2018 |
| KR | 10-2008-0050129 | 6/2008 |
| KR | 10-2016-0066272 | 6/2016 |
| WO | WO 2005/043584 A2 | 5/2005 |
| WO | WO 2009/021266 A1 | 2/2009 |
| WO | WO 2022/147429 A1 | 7/2022 |

OTHER PUBLICATIONS

Basol et al., "Study on the Mechanism of Electrochemical Mechanical Deposition of Copper Layers,"Nu Tool Inc., 1655 McCandless Drive, Milpitas, CA 95035, Electrochemical Processes in ULSI and MEMS, Proceedings of the International Symposium; Proceedings vol. 2004-17, pp. 155-160.
Che, F.X. et al., "Study on Cu protrusion of through-silicon via," IEEE Transactions on Components, Packaging and Manufacturing Technology, May 2013, vol. 3, No. 5, pp. 732-739.
Dela Pena, Eden M. et al., "Electrodeposited copper using direct and pulse currents from electrolytes containing low concentration of additives," School of Chemical and Process Engineering, University of Strathclyde, 2018 Surface and Coating Technology, 40 pages.
De Messemaeker, Joke et al., "Correlation between Cu microstructure and TSV Cu pumping," 2014 Electronic Components & Technology Conference, pp. 613-619.
Di Cioccio, L. et al., "An overview of patterned metal/dielectric surface bonding: Mechanism, alignment and characterization," Journal of The Electrochemical Society, 2011, vol. 158, No. 6, pp. P81-P86.
Ganesan, Kousik, "Capable copper electrodeposition process for integrated circuit-substrate packaging manufacturing," A dissertation presented in partial fulfillment of the requirments for the degree Doctor of Philosophy, Arizona State University, May 2018, 320 pages.
Gondcharton, P. et al., "Kinetics of low temperature direct copper-copper bonding," Microsyst Technol, 2015, vol. 21, pp. 995-1001.
Heryanto, A. et al., "Effect of copper TSV annealing on via protrusion for TSV wafer fabrication," Journal of Electronic Materials, 2012, vol. 41, No. 9, pp. 2533-2542.
Hobbs, Anthony et al., "Evolution of grain and micro-void structure in electroplated copper interconnects," Materials Transactions, 2002, vol. 43, No. 7, pp. 1629-1632.
Huang, Q., "Effects of impurity elements on isothermal grain growth of electroplated copper," Journal of The Electrochemical Society, 2018, vol. 165, No. 7, pp. D251-D257.
Huang, Q., "Impurities in the electroplated sub-50 nm Cu lines: The effects of the plating additives," Journal of The Electrochemical Society, 2014, vol. 161, No. 9, pp. D388-D394.
Jiang, T. et al., "Plasticity mechanism for copper extrusion in through-silicon vias for three-dimensional interconnects," Applied Physics Letters, 2013, vol. 103, pp. 211906-1-211906-5.
Juang, Jing-Ye et al., "Copper-to-copper direct bonding on highly (111)-oriented nanotwinned copper in no-vacuum ambient," Scientific Reports, Sep. 17, 2018, vol. 8, 11 pages.
Ker, Ming-Dou et al., "Fully process-compatible layout design on bond pad to improve wire bond reliability in CMOS ICS," IEEE Transactions on Components and Packaging Technologies, Jun. 2002, vol. 25, No. 2, pp. 309-316.
Khan, Muhammed et al., "Damascene Process and Chemical Mechanical Planarization," http://www.ece.umd.edu/class/enee416/GroupActivities/Damascene%20Presentation.pdf, 25 pages.
Kim, Myung Jun et al., "Characteristics of pulse-reverse electrodeposited Cu thin film," I. Effects of Anodic Step in the Absence of an Organic Additives, Journal of The Electrochemical Society, 2012, vol. 159, No. 9, pp. D538-D543.
Kim, Myung Jun et al., "Characteristics of pulse-reverse electrodeposited Cu thin film," II. Effects of Organic Additives, Journal of The Electrochemical Society, 2012, vol. 159, No. 9, pp. D544-D548.
Liu, C. et al., "Low-temperature direct copper-to-copper bonding enabled by creep on (111) surfaces of nanotwinned Cu," Scientific Reports, May 12, 2015, 5:09734, pp. 1-11.
Liu, Chien-Min et al., "Effect of grain orientations of Cu seed layers on the growth of <111>-oriented nanotwinned Cu," Scientific Reports, 2014, vol. 4, No. 6123, 4 pages.
Liu, Zi-Yu et al. "Detection and formation mechanism of micro-defects in ultrafine pitch Cu-Cu direct bonding," Chin. Phys. B, 2016, vol. 25, No. 1, pp. 018103-1-018103-7.
Lu, L. et al., "Grain growth and strain release in nanocrystalline copper," Journal of Applied Physics, vol. 89, Issue 11, pp. 6408.
Mendez, Julie Marie, "Characterization of copper electroplating and electropolishing processes for semiconductor interconnect metallization," Submitted in partial fulfillment of the requirements for the degree of Doctor of Philosophy, Department of Chemical Engineering, Case Western Reserve University, Aug. 2009, 140 pages.
Menk, L.A. et al., "Galvanostatic plating with a single additive electrolyte for bottom-up filling of copper in Mesoscale TSVs," Microsystems and Engineering Sciences Applications (MESA) Complex, Sandia National Laboratories, Albuquerque, New Mexico, 2019 J. Electrochem. Soc. 166, 17 pages.
Moriceau, H. et al., "Overview of recent direct wafer bonding advances and applications," Advances in Natural Sciences-Nanoscience and Nanotechnology, 2010, 11 pages.
Mott, D. et al., "Synthesis of size-controlled and shaped copper nanoparticles," Langmuir, 2007, vol. 23, No. 10, pp. 5740-5745.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
Ortleb, Thomas et al., "Controlling macro and micro surface topography for a 45nm copper CMP process using a high resolution profiler," Proc. of SPIE, 2008, vol. 6922, 11 pages.

(56) References Cited

OTHER PUBLICATIONS

Parthasaradhy, N.V., "Practical Electroplating Handbook," 1989, Prentice-Hall, Inc., pp. 54-56.
Plobi, A. et al., "Wafer direct bonding: tailoring adhesion between brittle materials," Materials Science and Engineering Review Journal, 1999, R25, 88 pages.
Saraswat, Stanford Presentation, Cu Interconnect slides, web page web.stanford.edu/class/ee311/NOTES/Cu_Interconnect_Slides.pdf, 19 pages.
Song, Xiaohui, "Atomic study of copper-copper bonding using nanoparticles," Journal of Electronic Packaging, Jun. 2020, vol. 142, 5 pages.
Song, Xiaoning, "Microstructure and mechanical properties of electrodeposited copper films," A thesis submitted to the College of Engineering and Physical Sciences of the University of Birmingham, 2011, web page etheses.bham.ac.uk/id/eprint/1764/, 111 pages.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Swingle, Karen D., "Nanograin Copper Deposition Using an Impinging Jet Electrode," A Thesis submitted in partial satisfaction of the requirements of the degree of Master of Science, University of California, San Diego, 2013, 102 pages.
Takahashi, K. et al., "Transport phenomena that control electroplated copper filling of submicron vias and trenches," Journal of The Electrochemical Society, 1999, vol. 146, No. 12, pp. 4499-4503.
Zheng, Z. et al., "Study of grain size effect of Cu metallization on interfacial microstructures of solder joints," Microelectronics Reliability, 2019, vol. 99, pp. 44-51.
Basol et al., "Electrochemical mechanical deposition (ECMDT technique for semiconductor interconnect applications," Microelectronic Engineering, 2002, vol. 64, pp. 43-51.
Basol et al., "Planar copper plating and electropolishing techniques, "Chemical Engineering Communication, Jul. 2006, 14 pages.
Berla et al., "A Model for Power Law Creep Controlled Hillock Growth". Materials Science and Engineering: A. Aug. 15, 2008;488(1-2): 594-600.
Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Chiu et al., "Low-Temperature Wafer-to-Wafer Hybrid Bonding by Nanocrystalline Copper". In 2022 IEEE 72nd Electronic Components and Technology Conference (ECTC) May 31, 2022 (pp. 679-684).
Ericson et al., A transmission electron microscopy study of hillocks in Thin Aluminum Films. J Vac Sci Technol. B: Jan. 1, 1991;9(1): 58-63.
Hu et al., "Two-Step Ar/$N_2$ Plasma-Activated Al Surface for Al—Al Direct Bonding". In 2022 IEEE 72nd Electronic Components and Technology Conference (ECTC) May 31, 2022 (pp. 324-329); doi: 10.1109/ECTC51906.2022.00060.
Hwang et al., "A Model for Hillock Growth in Al Thin Films Controlled by Plastic Deformation". Acta Materialia. Sep. 1, 2007;55(15): 5297-5301.
Hwang et al., "Effect of Film Thickness and Annealing Temperature on Hillock Distributions in Pure Al Films". Scripta materialia. Jan. 1, 2007;56(1): 17-20.
Iwamura et al., "Effect of Aluminum Oxide Caps on Hillock Formation in Aluminum Allow Films". Thin Solid Films. Jul. 30, 1999;349(1-2): 191-198.

Mori E., "Suppression of Byproduct Accumulation in Rechargeable Aluminum-Air Batteries Using Non-Oxide Ceramic Materials as Air Cathode Materials". Sustainable Energy & Fuels. 2017;1(5): 1082-1089.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.".
Rebhan et al., "Low-Temperature Aluminum-Aluminum Wafer Bonding". ECS Transactions. Aug. 24, 2016;75(9): 15; 10 pages.
Roy, A. et al., "Annealing effects on the surface properties of Cu—TiC thin films," Materials Today: Proceedings, 2021, vol. 44, Part 1, pp. 170-175.
Santoro C.J., "Thermal Cycling and Surface Reconstruction in Aluminum Thin Films". Journal of the Electrochemical Society. Mar. 1, 1969;116(3):361-364.
Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).
Zik, N. et al., "Thermally produced nano catalyst for biodiesel production: A review," Journal of Advanced Research in Fluid Mechanics and Thermal Sciences, 2018, vol. 52, Issue 2, pp. 139-147.
International Search Report and Written Opinion for PCT/US2023/084424, dated Apr. 1, 2024, 11 pages.
Chen et al., "Wafer Level Bonding Using Localized Radio-Frequency Induction Heating". Science China Technological Sciences. May 2010;53: 1252-1257.
Classone Technologies, "Copper RDL Plating"—Using the Solstice® CopperMax™ Reactor, downloaded from https://classone.com/electroplating/copper-rdl-plating/ on Sep. 11, 2024; 3 pages.
Das et al., "Theory of welding of metallic parts in microwave cavity applicator," Fundamental J. Modern Physics. 2012;3(2): 125-155.
Diehm et al., "Low temperature processing of highly integrated assemblies by selective microwave heating". 2006 1st Electronic Systemintegration Technology Conference, Dresden, Germany, 2006, pp. 608-611, doi: 10.1109/ESTC.2006.280066.
Hofmann et al., "Localized Induction Heating of Cu—Sn Layers for Rapid Solid-Liquid Interdiffusion Bonding Based on Miniaturized Coils," Micromachines. Aug. 12, 2022;13(8): 1307 in 24 pages.
Iwai, T. et al., "Influence of microwave annealing on optical and electrical properties of plasma-induced defect structures in Si substrate," Journal of Vacuum Science & Technology A, 2015, vol. 33, Issue 6, pp. 061403-1-061403-9.
Kimura, M. et al., "Investigation of implantation damage recovery using microwave annealing for high performance image sensing devices," ITE Trans. on MTA, 2016, vol. 4, No. 2, pp. 85-90.
Kowalski et al., "Microwave annealing for low temperature activation". In 2007 15th International Conference on Advanced Thermal Processing of Semiconductors Oct. 2, 2007 (pp. 51-56). IEEE.
Lee, I.K. et al., "Microwave annealing effect for highly reliable biosensor: dual-gate ion-sensitive field-effect transistor using amorphous InGaZnO thin-film transistor," ACS Appl Mater Interfaces, Dec. 2014, vol. 6, No. 24, pp. 22680-22686.
Pankratov, E.L., "Redistribution of dopant during microwave annealing of a multilayer structure for production p-n junction," Journal of Applied Physics, 2008, vol. 103, Issue 6, pp. 064320-1-064320-10.

(56) References Cited

OTHER PUBLICATIONS

Zhang, Q.X. et al., "The effects of rapid thermal annealing and microwave annealing on the electrical properties of ZrO2 metal-insulator-metal capacitors," Optik, Feb. 2019, vol. 179, pp. 1057-1062.

\* cited by examiner

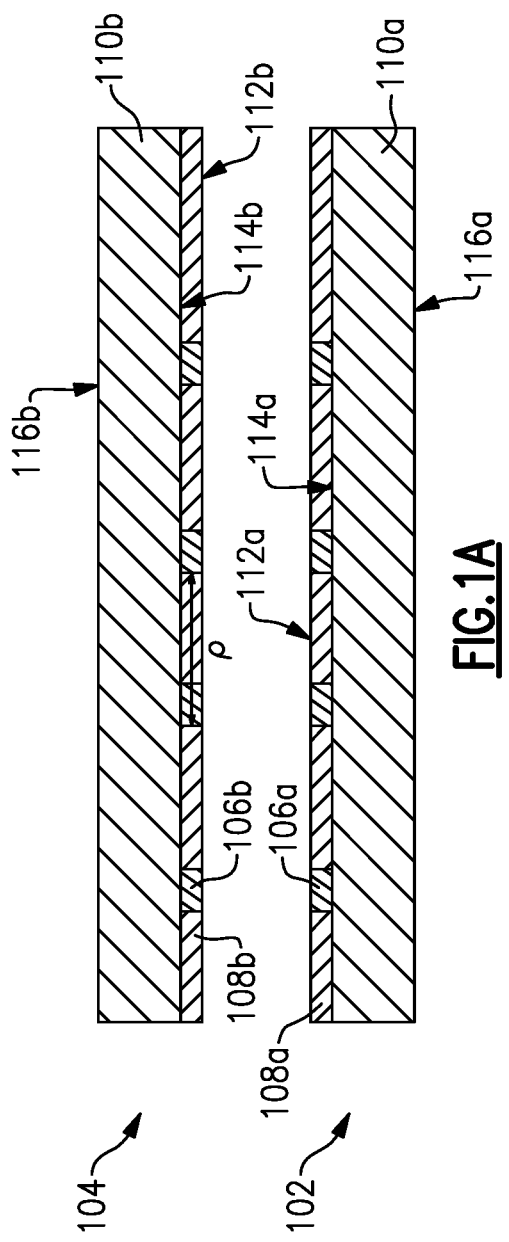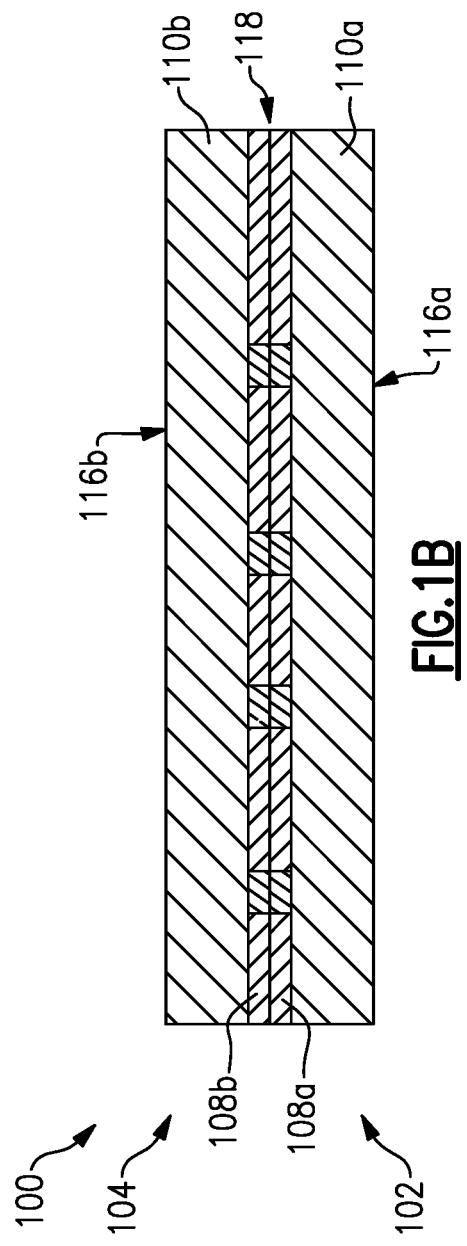

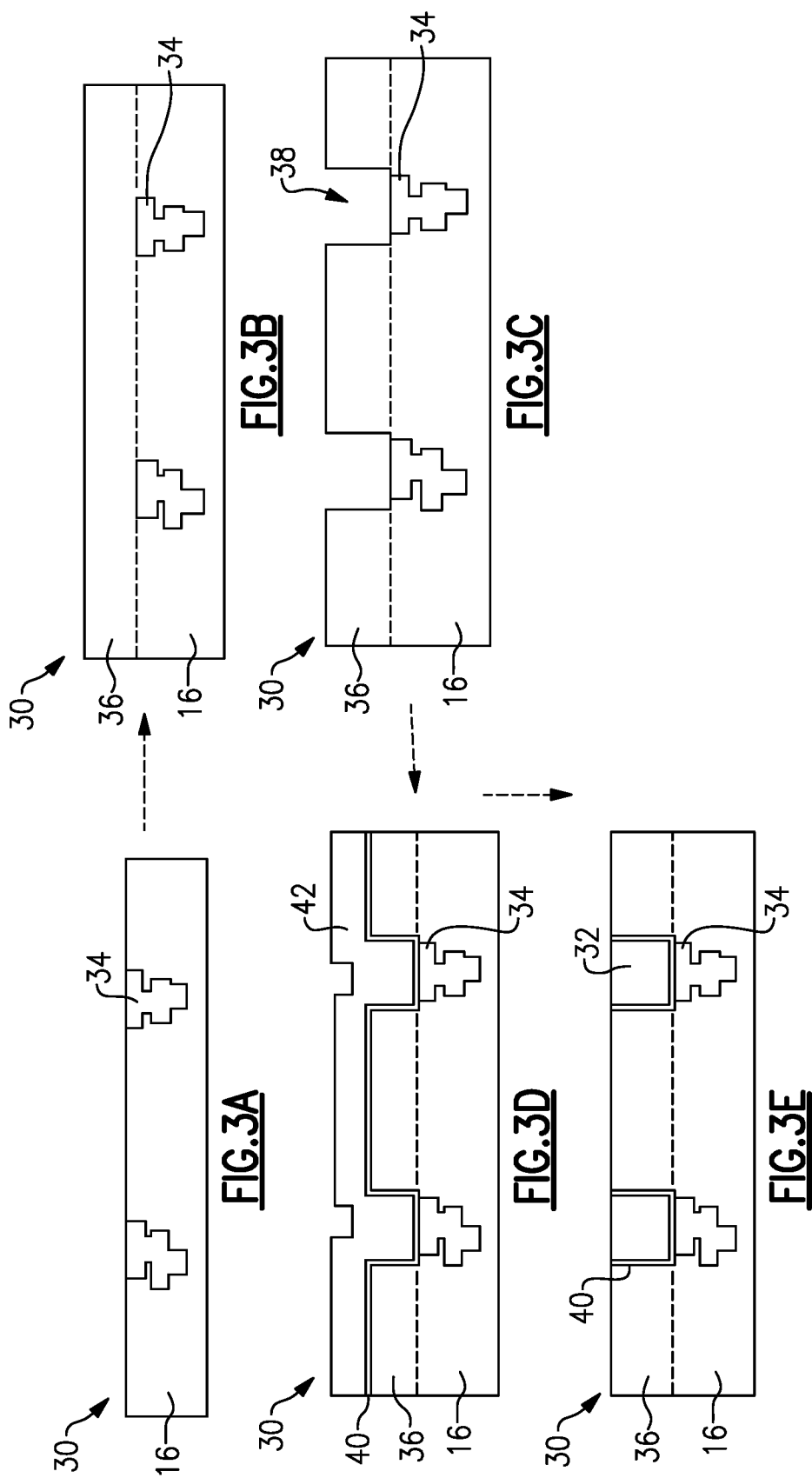

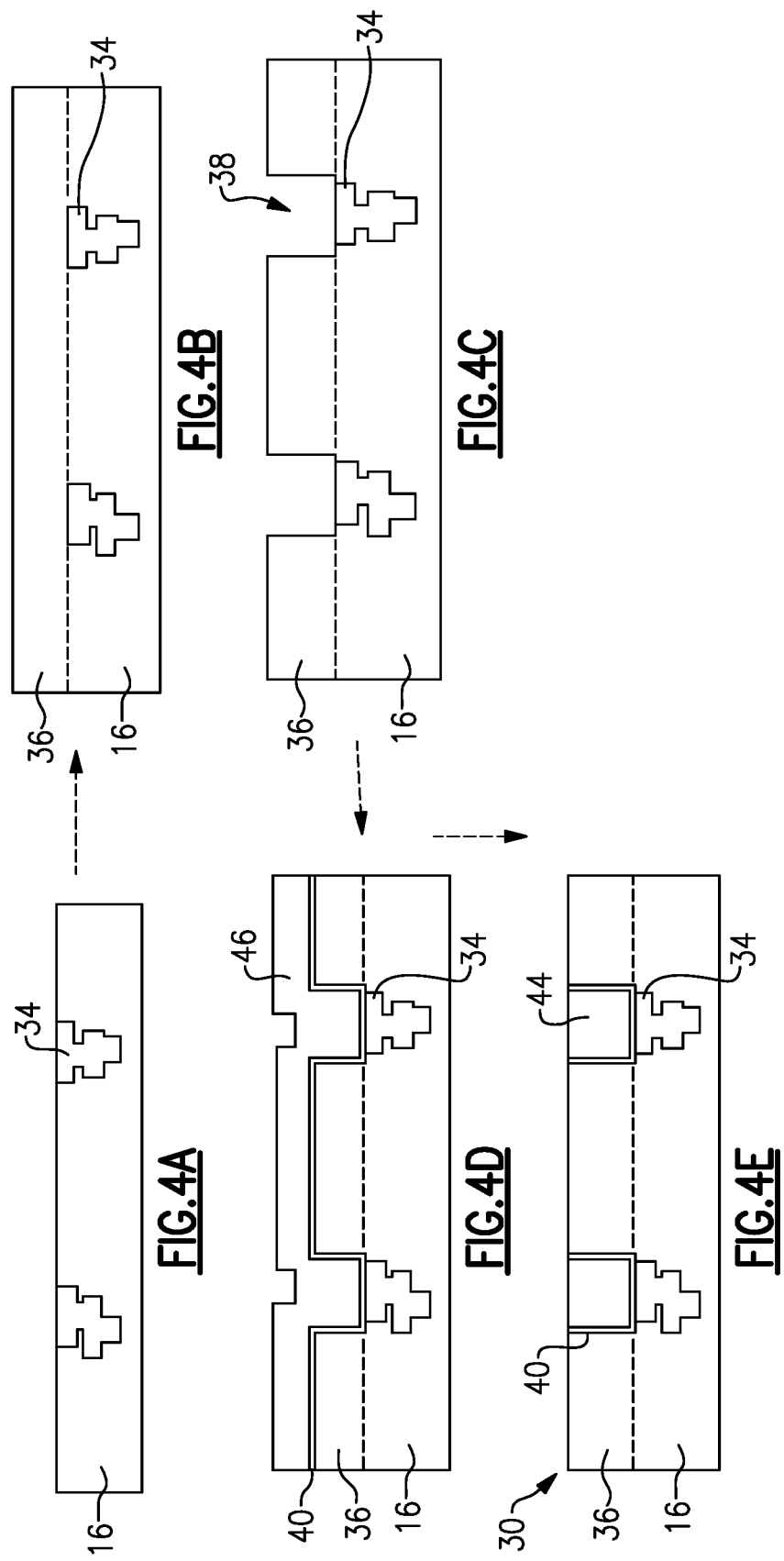

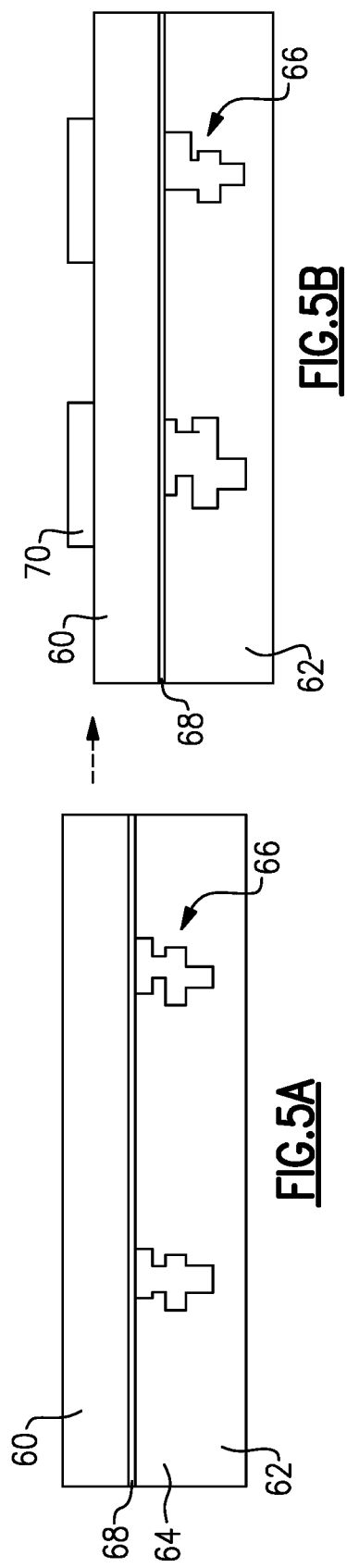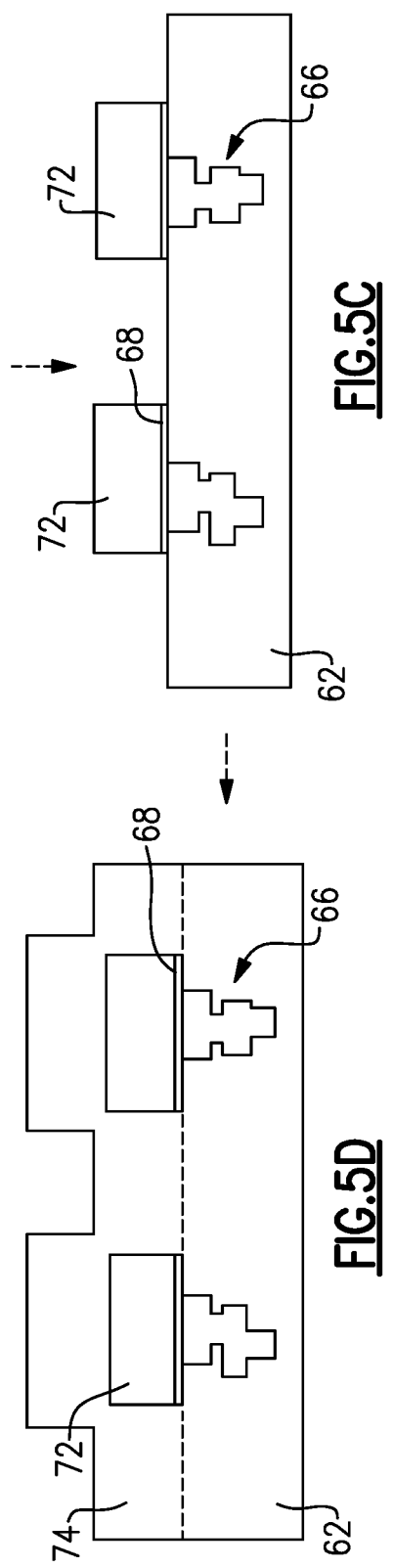

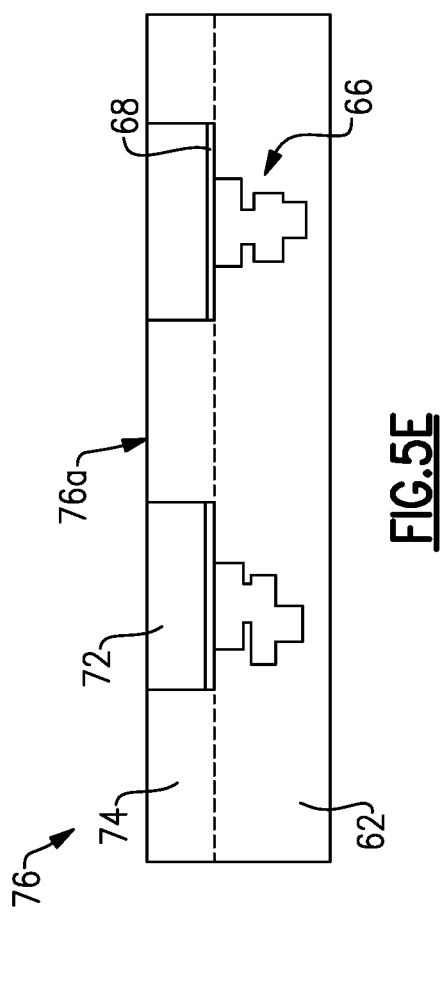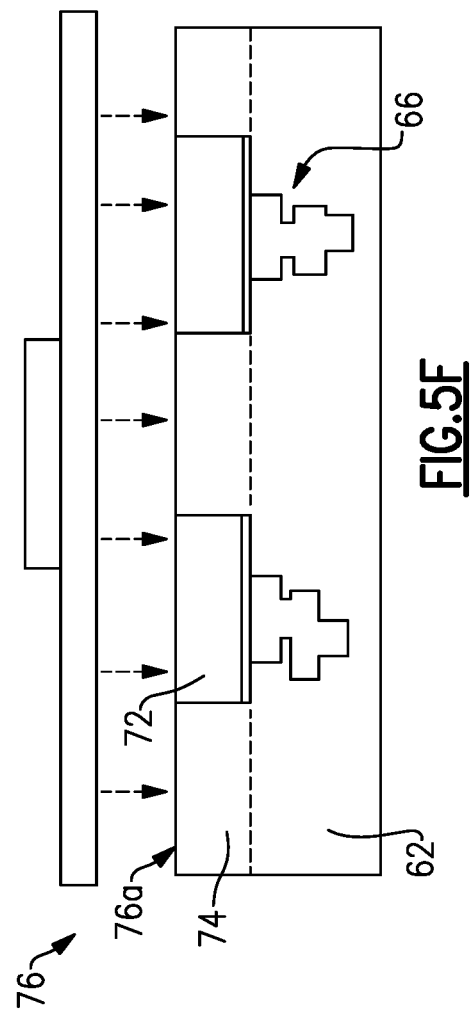

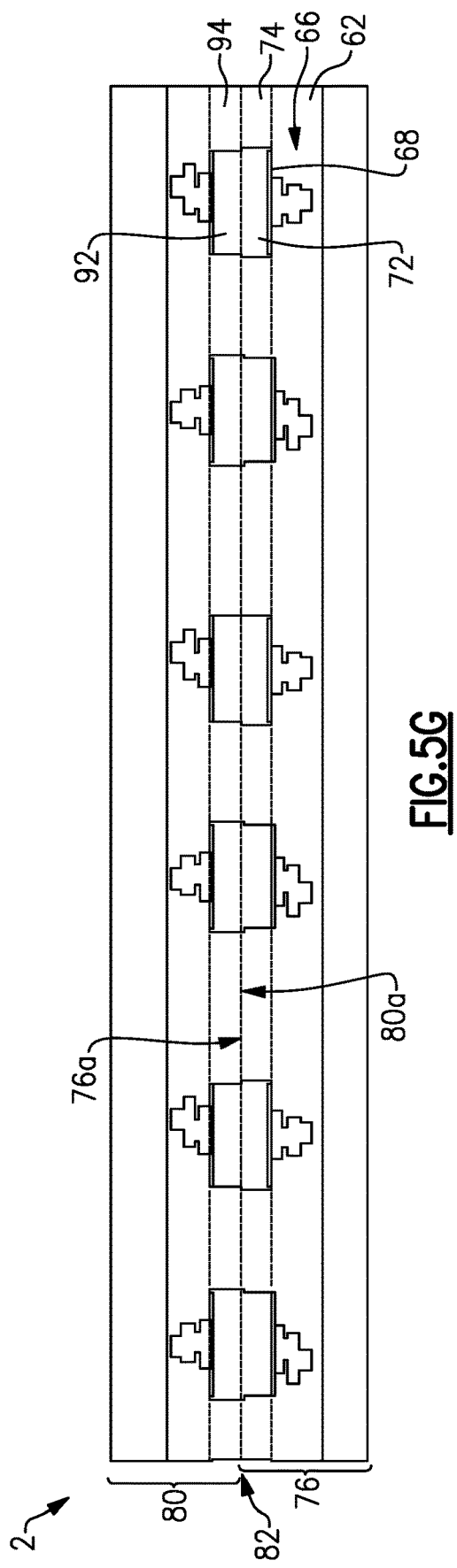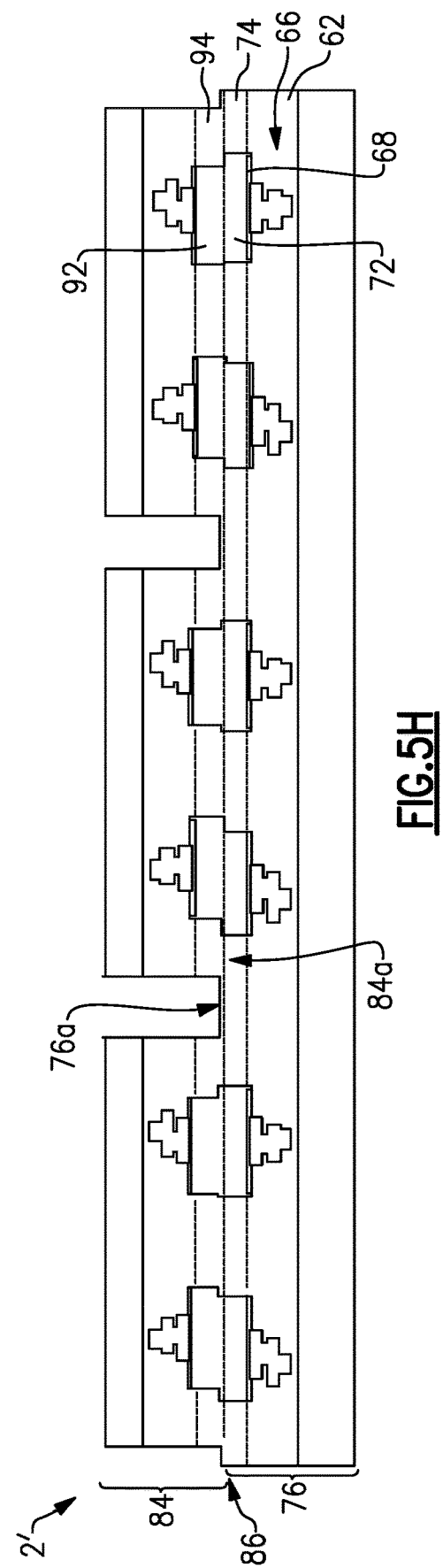

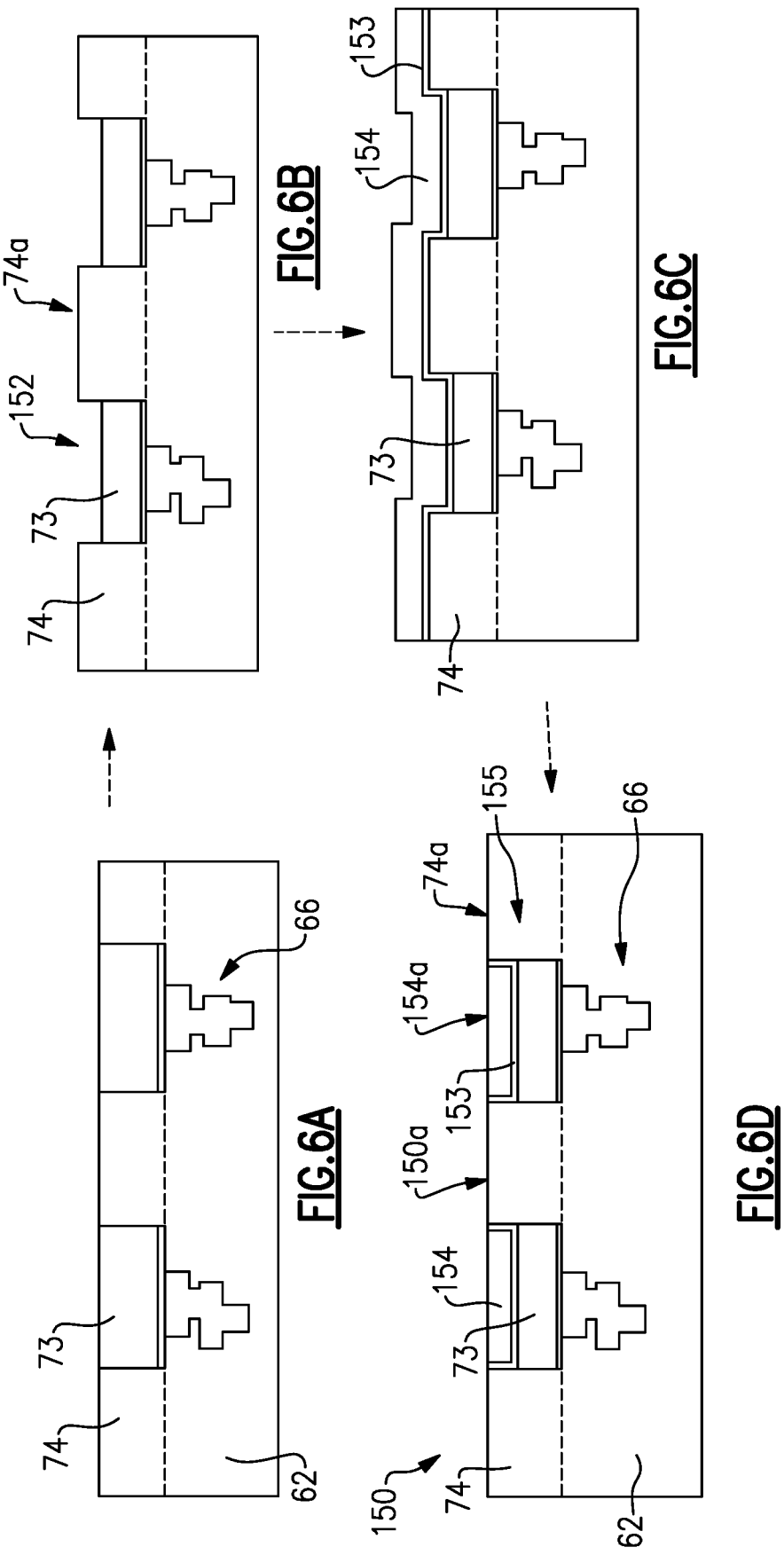

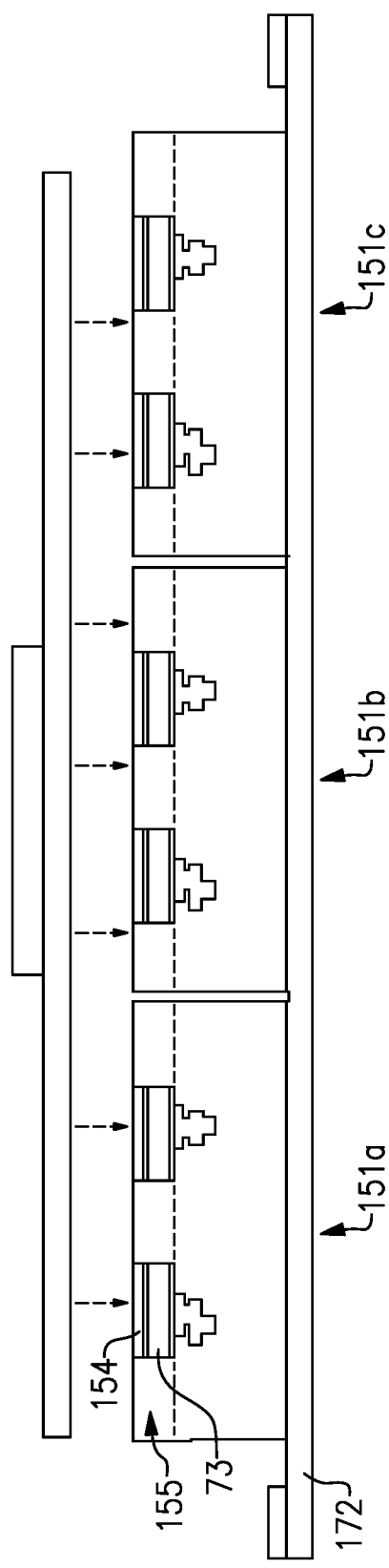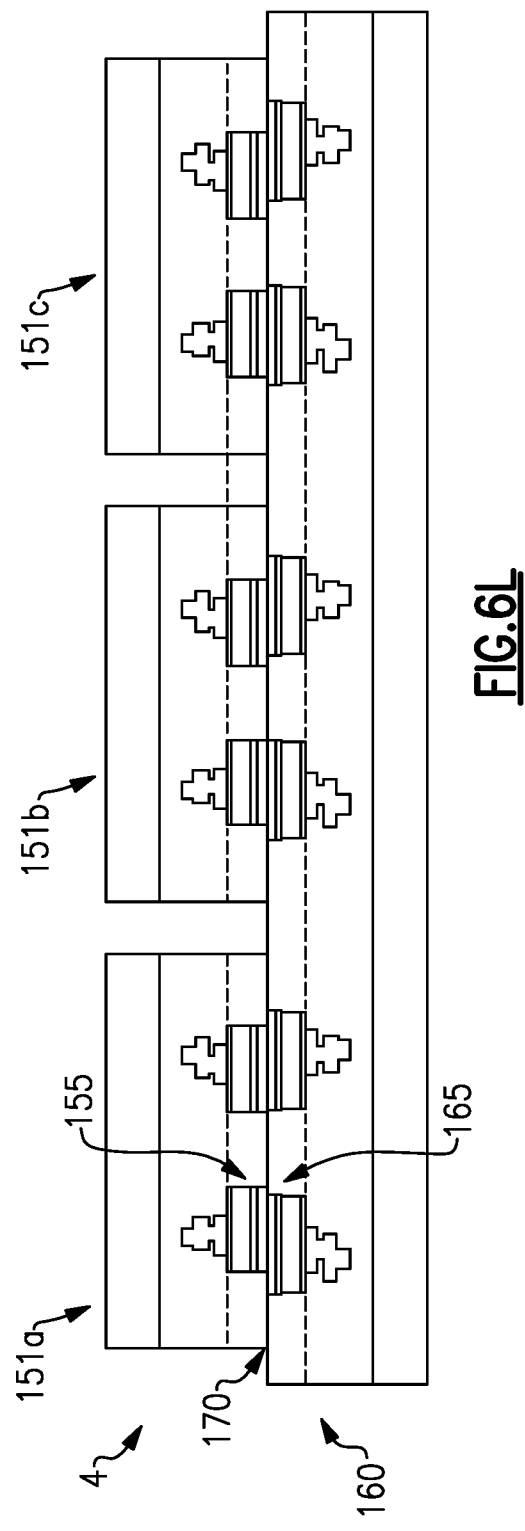

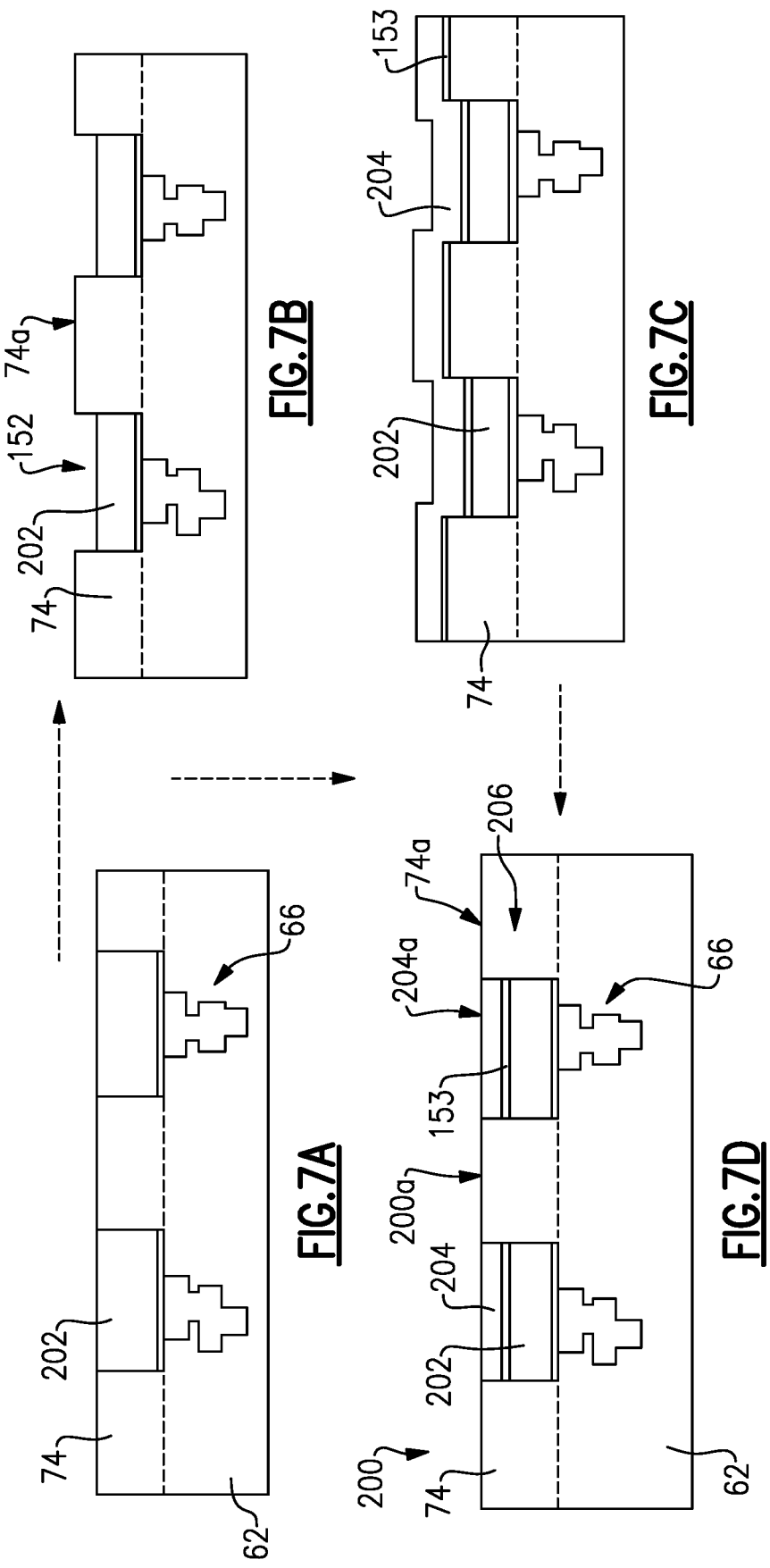

DIRECTLY BONDED METAL STRUCTURES HAVING ALUMINUM FEATURES AND METHODS OF PREPARING SAME

BACKGROUND

Field

The field relates to bonded structures and methods of forming direct metal bonds that include aluminum features.

Description of the Related Art

Microelectronic elements, such as integrated device dies or chips, may be mounted or stacked on other elements thereby forming a bonded structure. Direct metal bonding can be conducted at low temperatures and without external pressure. For example, direct hybrid bonding involves directly bonding non-conductive features (e.g., inorganic dielectrics) of different elements together, without intervening adhesives, while also directly bonding conductive features (e.g., metal pads or lines) of the elements together. For example, a microelectronic element can be mounted to a carrier, such as an interposer, a reconstituted wafer or element, etc. As another example, a microelectronic element can be stacked on top of another microelectronic element, e.g., a first integrated device die can be stacked on a second integrated device die. Each of the microelectronic elements can have conductive pads for mechanically and electrically bonding the elements to one another. There is a continuing need for improved methods for forming the bonded structure.

BRIEF DESCRIPTION OF THE DRAWINGS

Specific implementations will now be described with reference to the following drawings, which are provided by way of example, and not limitation.

FIG. 1A is a schematic cross-sectional side view of two elements prior to direct hybrid bonding.

FIG. 1B is a schematic cross-sectional side view of the two elements shown in FIG. 1A after direct hybrid bonding.

FIGS. 3A-3E are schematic cross sections showing a method of forming copper pads over aluminum interconnects formed in a back-end-of-line (BEOL) layer of an element.

FIGS. 4A-4E are schematic cross sections showing a method of forming aluminum pads over aluminum interconnects formed in a BEOL layer of an element.

FIGS. 5A to 5F are schematic cross sections showing a method of forming a bonding surface of an element that includes conductive features, according to an embodiment.

FIG. 5G is a schematic cross-sectional side view of a bonded structure that includes the element formed in FIG. 5F and a second element (such as a wafer).

FIG. 5H is a schematic cross-sectional side view of a bonded structure that includes the element formed in FIG. 5F and a plurality of second elements (such as dies).

FIGS. 6A to 6E are schematic cross sections showing a method of forming a bonding surface of an element that includes conductive features having fine grain aluminum, according to an embodiment.

FIG. 6K shows the element of FIG. 6D after singulation and during a termination process.

FIG. 6L is a schematic cross-sectional side view of a bonded structure that includes the singulated elements of FIG. 6K.

FIGS. 7A to 7E are schematic cross sections showing a method of forming a bonding surface of an element that includes conductive features having fine grain copper, according to an embodiment.

DETAILED DESCRIPTION

Figure 2:
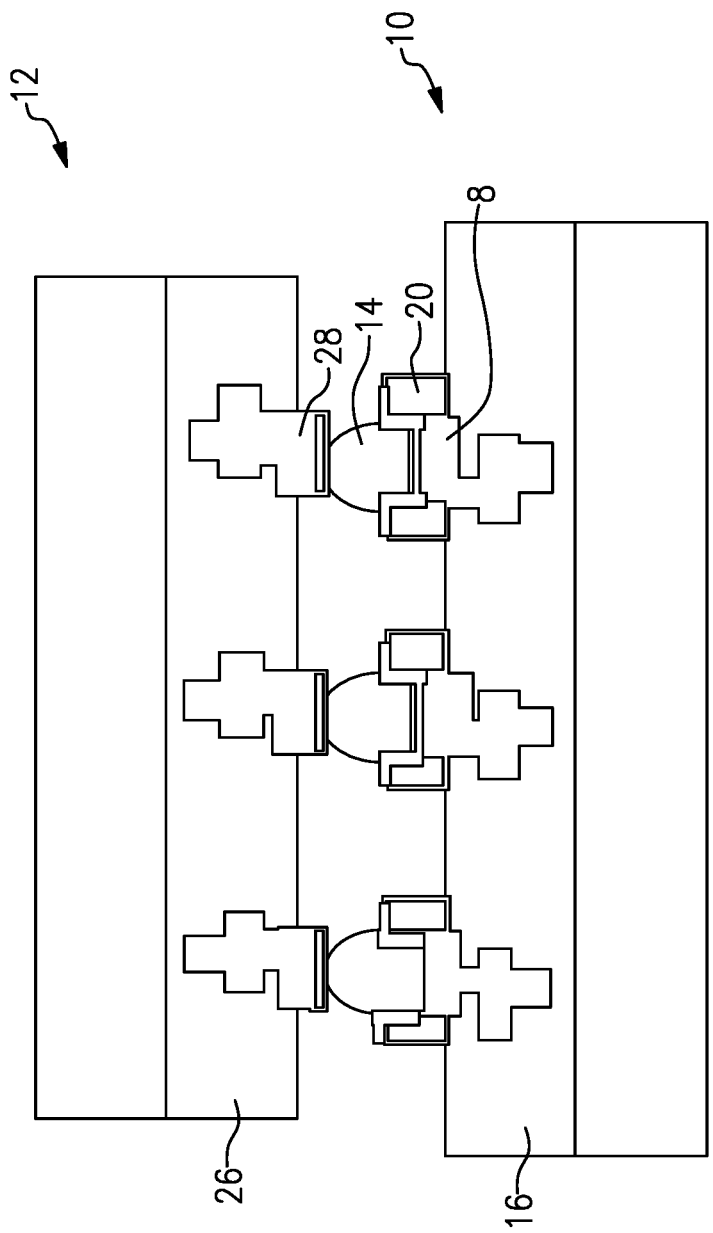
FIG. 2 is a schematic cross-sectional side view of a bonded structure including elements bonded through solder balls.

Various embodiments disclosed herein relate to directly bonded structures in which two or more elements can be directly bonded to one another without an intervening adhesive. FIGS. 1A and 1B schematically illustrate a process for forming a directly hybrid bonded structure without an intervening adhesive according to some embodiments. In FIGS. 1A and 1B, a bonded structure 100 comprises first and second elements 102 and 104 that can be directly bonded to one another at a bond interface 118 without an intervening adhesive. Two or more microelectronic elements 102 and 104 (such as semiconductor elements, including, for example, integrated device dies, wafers, passive devices, individual active devices such as power switches, etc.) may be stacked on or bonded to one another to form the bonded structure 100. Conductive features 106a (e.g., contact pads, exposed ends of vias or through substrate vias (TSVs), elongated traces, etc. of the first element 102 may be mechanically and electrically connected to corresponding conductive features 106b of the second element 104. Any suitable number of elements can be stacked in the bonded structure 100. For example, a third element (not shown) can be stacked on the second element 104, a fourth element (not shown) can be stacked on the third element, and so forth. Additionally or alternatively, one or more additional elements (not shown) can be stacked laterally adjacent one another along the first element 102. In some embodiments, the laterally adjacent additional stacked element(s) may be smaller than the second element. In some embodiments, the laterally adjacent additional stacked element(s) may be less than half the size of the second element in lateral dimensions.

In some embodiments, the elements 102 and 104 are directly bonded to one another without an adhesive. In various embodiments, a non-conductive field region, which includes a non-conductive or dielectric material can serve as a first bonding layer 108a of the first element 102. The first bonding layer 108a can be directly bonded to a corresponding non-conductive field region that includes a non-conductive or dielectric material serving as a second bonding layer 108b of the second element 104 without an adhesive. The non-conductive bonding layers 108a and 108b can be disposed on respective front sides 114a and 114b of device portions 110a and 110b, such as a semiconductor (e.g., silicon) portion of the elements 102, 104. Active devices and/or circuitry can be patterned and/or otherwise disposed in or on the device portions 110a and 110b. Active devices and/or circuitry can be disposed at or near the front sides 114a and 114b of the device portions 110a and 110b, and/or at or near opposite backsides 116a and 116b of the device portions 110a and 110b. Bonding layers can be provided on front sides and/or back sides of the elements. The non-conductive material can be referred to as a non-conductive bonding region or bonding layer 108a of the first element 102. In some embodiments, the non-conductive bonding layer 108a of the first element 102 can be directly bonded to the corresponding non-conductive bonding layer 108b of the second element 104 using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 108a and/or 108b can comprise a non-conductive material such as a dielectric material, for example, silicon oxide, or an undoped semiconductor material, for example, undoped silicon. Suitable dielectric bonding surface or materials for direct bonding include but are not limited to inorganic dielectrics, such as silicon oxide, silicon nitride, or silicon oxynitride, and can include carbon, such as silicon carbide, silicon oxycarbonitride, low K dielectric materials, SiCOH dielectrics, silicon carbonitride, glass, ceramics, glass-ceramics, or diamond-like carbon or a material comprising a diamond surface. Such carbon-containing materials can be considered inorganic, despite the inclusion of carbon. In some embodiments, the dielectric materials do not comprise adhesive or polymer materials, such as epoxy, resin or molding materials. In some embodiments, including embodiments described hereinbelow, the dielectric bonding surfaces are defined by wafer-level processing of the underlying devices, such as the upper interlevel dielectric or passivation layers formed in back-end-of-line (BEOL) processing of an integrated circuit, and no separate bonding layer is deposited after formation of the underlying device.

In some embodiments, the device portions 110a and 110b can have significantly different coefficients of thermal expansion (CTEs) defining a heterogenous structure. The CTE difference between the device portions 110a and 110b, and particularly between bulk semiconductor, typically single crystal portions of the device portions 110a, 110b, can be greater than 5 ppm or greater than 10 ppm. For example, the CTE difference between the device portions 110a and 110b can be in a range of 5 ppm to 100 ppm, 5 ppm to 40 ppm, 10 ppm to 100 ppm, or 10 ppm to 40 ppm. In some embodiments, one of the device portions 110a and 110b can comprise optoelectronic single crystal materials, including perovskite materials, that are useful for optical piezoelectric or pyroelectric applications, and the other of the device portions 110a, 110b comprises a more conventional substrate material (Si, Ge, SiGe, III-V material, etc.). For example, one of the device portions 110a, 110b comprises lithium tantalate (LiTaO$_3$) or lithium niobate (LiNbO$_3$), and the other one of the device portions 110a, 110b comprises silicon (Si), quartz, fused silica glass, sapphire, or a glass. In other embodiments, one of the device portions 110a and 110b comprises a III-V single semiconductor material, such as gallium arsenide (GaAs) or gallium nitride (GaN), and the other one of the device portions 110a and 110b can comprise a non-III-V semiconductor material, such as silicon (Si) and/or germanium (Ge), or can comprise other materials with similar CTE, such as quartz, fused silica glass, sapphire, or a glass.

In various embodiments, direct hybrid bonds can be formed without an intervening adhesive. For example, non-conductive bonding surfaces 112a and 112b can be polished to a high degree of smoothness. The nonconductive bonding surfaces 112a and 112b can be polished using, for example, chemical mechanical polishing (CMP). The roughness of the polished bonding surfaces 112a and 112b can be less than 30 Å rms. For example, the roughness of the bonding surfaces 112a and 112b can be in a range of about 0.1 Å rms to 15 Å rms, 0.5 Å rms to 10 Å rms, or 1 Å rms to 5 Å rms. The bonding surfaces 112a and 112b can be cleaned and exposed to a plasma and/or etchants to activate the surfaces 112a and 112b. In some embodiments, the surfaces 112a and 112b can be terminated with a species after activation or during activation (e.g., during the plasma and/or etch processes). Without being limited by theory, in some embodiments, the activation process can be performed to break chemical bonds at the bonding surfaces 112a and 112b, and the termination process can provide additional chemical species at the bonding surfaces 112a and 112b that improves the bonding energy during direct bonding. In some embodiments, the activation and termination are provided in the same step, e.g., a plasma to activate and terminate the surfaces 112a and 112b. In other embodiments, the bonding surfaces 112a and 112b can be terminated in a separate treatment to provide the additional species for direct bonding. In various embodiments, the terminating species can comprise nitrogen. For example, in some embodiments, the bonding surface(s) 112a, 112b can be exposed to a nitrogen-containing plasma. Further, in some embodiments, including embodiments described in more detail hereinbelow, the bonding surfaces 112a and 112b can be exposed to fluorine. For example, there may be one or multiple fluorine peaks at or near a bond interface 118 between the first and second elements 102, 104. Thus, in the directly bonded structure 100, the bond interface 118 between two non-conductive materials (e.g., the bonding layers 108a and 108b) can comprise a very smooth interface with higher nitrogen content and/or fluorine peaks at the bond interface 118. In embodiments described hereinbelow, fluorine can be found at or near the bond interface 118 of both non-conductive regions 108a/108b and conductive regions 106a/106b of the bonded structure 100. Additional examples of activation and/or termination treatments may be found throughout U.S. Pat. Nos. 9,564,414; 9,391,143; and 10,434,749, the entire contents of each of which are incorporated by reference herein in their entirety and for all purposes. The roughness of the polished bonding surfaces 112a and 112b can be slightly rougher (e.g., about 1 Å rms to 30 Å rms, 3 Å rms to 20 Å rms, or possibly rougher) after an activation process.

In various embodiments, conductive features 106a of the first element 102 can also be directly bonded to corresponding conductive features 106b of the second element 104. For example, a direct hybrid bonding technique can be used to provide conductor-to-conductor direct bonds along the bond interface 118 that includes covalently direct bonded non-conductive-to-non-conductive (e.g., dielectric-to-dielectric) surfaces, prepared as described above. In various embodiments, the conductor-to-conductor (e.g., conductive feature 106a to conductive feature 106b) direct bonds and the dielectric-to-dielectric hybrid bonds can be formed using the direct bonding techniques similar to those disclosed at least in U.S. Pat. Nos. 9,716,033 and 9,852,988, the entire contents of each of which are incorporated by reference herein in their entirety and for all purposes. In embodiments described hereinbelow, aluminum can be employed in place of copper at the bonding surfaces, and fluorine termination can be employed in place of the nitrogen terminations described in the incorporated disclosures. In direct hybrid bonding embodiments described herein, conductive features are provided within non-conductive bonding layers, and both conductive and nonconductive features are prepared for direct bonding, such as by the planarization, activation and/or termination treatments described above. Thus, the bonding surface prepared for direct bonding includes both conductive and non-conductive features. Specific additional preparation options for directly bonding aluminum conductive features are described hereinbelow.

For example, non-conductive (e.g., dielectric) bonding surfaces 112a, 112b (for example, inorganic dielectric surfaces) can be prepared and directly bonded to one another without an intervening adhesive as explained above. Conductive contact features (e.g., conductive features 106a and 106b which may be partially or fully surrounded by non-conductive dielectric field regions within the bonding layers 108a, 108b) may also directly bond to one another without an intervening adhesive. In various embodiments, the conductive features 106a, 106b can comprise discrete pads or traces at least partially embedded in the non-conductive field regions. In some embodiments, the conductive contact features can comprise exposed contact surfaces of through substrate vias (e.g., through silicon vias (TSVs)). In some embodiments, the respective conductive features 106a and 106b can be recessed below exterior (e.g., upper) surfaces (non-conductive bonding surfaces 112a and 112b) of the dielectric field region or non-conductive bonding layers 108a and 108b, for example, recessed by less than 30 nm, less than 20 nm, less than 15 nm, or less than 10 nm, for example, recessed in a range of 2 nm to 20 nm, or in a range of 4 nm to 10 nm. In various embodiments, prior to direct bonding, the recesses in the opposing elements can be sized such that the total gap between opposing contact pads is less than 15 nm, or less than 10 nm. The non-conductive bonding layers 108a and 108b can be directly bonded to one another without an adhesive at room temperature in some embodiments and, subsequently, the bonded structure 100 can be annealed. Upon annealing, the conductive features 106a and 106b can expand and contact one another to form a metal-to-metal direct bond. Beneficially, the use of Direct Bond Interconnect, or DBI®, techniques commercially available from Adeia of San Jose, CA, can enable high density of conductive features 106a and 106b to be connected across the direct bond interface 118 (e.g., small or fine pitches for regular arrays). In various embodiments, the conductive features 106a and 106b and/or traces can comprise copper or copper alloys, although other metals may be suitable. For example, the conductive features disclosed herein, such as the conductive features 106a and 106b, can comprise fine-grain metal (e.g., a fine-grain copper). In specific embodiments described hereinbelow, at least one of the conductive features 106a and 106b is predominantly aluminum or includes a predominantly aluminum portion.

Thus, in direct bonding processes, a first element 102 can be directly bonded to a second element 104 without an intervening adhesive. In some arrangements, the first element 102 can comprise a singulated element, such as a singulated integrated device die. In other arrangements, the first element 102 can comprise a carrier or substrate (e.g., a wafer) that includes a plurality (e.g., tens, hundreds, or more) of device regions that, when singulated, form a plurality of integrated device dies. Similarly, the second element 104 can comprise a singulated element, such as a singulated integrated device die. In other arrangements, the second element 104 can comprise a carrier or substrate (e.g., a wafer). The embodiments disclosed herein can accordingly apply to wafer-to-wafer (W2W), die-to-die (D2D), or die-to-wafer (D2W) bonding processes. In wafer-to-wafer (W2W) processes, two or more wafers can be directly bonded to one another (e.g., direct hybrid bonded) and subsequently singulated using a suitable singulation process. After singulation, side edges of the singulated structure (e.g., the side edges of the two bonded elements) may be substantially flush and may include markings indicative of the common singulation process for the bonded structure (e.g., saw markings if a saw singulation process is used).

As explained herein, the first and second elements 102 and 104 can be directly bonded to one another without an adhesive, which is different from a deposition process and results in a structurally different interface compared to a deposition. In one application, a width of the first element 102 in the bonded structure is similar to a width of the second element 104. In some other embodiments, a width of the first element 102 in the bonded structure 100 is different from a width of the second element 104. Similarly, the width or area of the larger element in the bonded structure may be at least 10% larger than the width or area of the smaller element. The first and second elements 102 and 104 can accordingly comprise non-deposited elements. Further, directly bonded structures 100, unlike deposited layers, can include a defect region along the bond interface 118 in which nanometer-scale voids (nanovoids) are present. The nanovoids may be formed due to activation of the bonding surfaces 112a and 112b (e.g., exposure to a plasma). As explained above, the bond interface 118 can include concentration of materials from the activation and/or last chemical treatment processes. For example, in embodiments that utilize a nitrogen plasma for activation, a nitrogen peak can be formed at the bond interface 118. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen peak can be formed at the bond interface 118. In illustrated embodiments described hereinbelow, employing fluorine treatment for termination, a fluorine peak can be formed at the bond interface 118. In some embodiments, the bond interface 118 can comprise silicon oxynitride, silicon oxycarbonitride, or silicon carbonitride. As explained herein, the direct bond can comprise a covalent bond, which is stronger than van Der Waals bonds. The bonding layers 108a and 108b can also comprise polished surfaces that are planarized to a high degree of smoothness.

In various embodiments, the metal-to-metal bonds between the conductive features 106a and 106b can be joined such that metal grains grow into each other across the bond interface 118. In some examples of direct hybrid bonding, the metal is or includes copper, which can have grains oriented along the 111 crystal plane for improved copper diffusion across the bond interface 118. In some examples of direct hybrid bonding, the conductive features 106a and 106b may include nanotwinned copper grain structure, which can aid in merging the conductive features during anneal. In illustrated embodiments described hereinbelow, one or both of the conductive features 106a and 106b comprise fluorine-treated aluminum. The bond interface 118 can extend substantially entirely to at least a portion of the bonded conductive features 106a and 106b, such that there is substantially no gap between the non-conductive bonding layers 108a and 108b at or near the bonded conductive features 106a and 106b. In some embodiments, a barrier layer may be provided under and/or laterally surrounding the conductive features 106a and 106b (e.g., which may include copper). In other embodiments, however, there may be no barrier layer under the conductive features 106a and 106b, for example, as described in U.S. Pat. No. 11,195,748, which is incorporated by reference herein in its entirety and for all purposes.

Beneficially, the use of the direct hybrid bonding techniques described herein can enable extremely fine pitch between adjacent conductive features 106a and 106b, and/or small pad sizes. For example, in various embodiments, the pitch p (i.e., the distance from edge-to-edge or center-to-center, as shown in FIG. 1A) between adjacent conductive features 106a (or 106b) can be in a range of 0.5 microns to 100 microns, 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

As described above, the non-conductive bonding layers 108a, 108b can be directly bonded to one another without an adhesive and, subsequently, the bonded structure 100 can be annealed. Upon annealing, the conductive features 106a, 106b can expand and contact one another to form a metal-to-metal direct bond. In some embodiments, the materials of the conductive features 106a, 106b can interdiffuse during the annealing process.

FIG. 2 is a schematic cross-sectional side view of a bonded structure 1. The bonded structure 1 includes a first element 10 and a second element 12 bonded by way of solder balls 14. The first element 10 includes a first back end of line (BEOL) layer 16 and aluminum pads 18. A polymer layer 20 can be disposed over a surface of the BEOL layer 16 for supporting the solder balls 14. The second element 12 includes a second BEOL layer 26 and aluminum pads 28. The solder balls 14 are provided with the first element 10 and bonded to the aluminum pads 28 of the second element 12.

Using the solder balls 14 may not be feasible for relatively fine pitch interconnects, such as an interconnect pitch of less than 20 microns, or less than 2 microns. Additionally, because the mechanical connection between the elements 10 and 12 is limited to the solder joints, the mechanical connection can be weak and subject to separation from physical stresses or shocks because of the brittle intermetallic compound (IMC) typically formed with the solder balls. After bonding, the gap between the top surfaces of the BEOL layers 16, 26 are cleaned and filled with a dielectric underfill material (not shown) to encapsulate the solder balls 14 and corresponding contacts. The resistivity of the alloy formed with the solder which is typically at least 3 times higher than that of an aluminum pad or copper post, can cause electrical losses. Also, the dielectric underfill that mechanically connects the top surfaces of the BEOL layers 16, 26 impedes heat transfer between the first element 10 and the second element 12. Therefore, it can be beneficial to provide a bond surface that can directly hybrid bond the elements 10, 12 together.

FIGS. 3A-3E show a method of forming copper pads 32 over aluminum pads or interconnects 34 formed with a BEOL layer 16 of an element 30. At FIG. 3A, the BEOL layer 16 can be provided. The BEOL layer 16 can include a planar dielectric surface and aluminum pads or interconnects 34 that are at least partially embedded in the dielectric. As shown in FIG. 3B, the method includes forming a planarized dielectric layer 36 over the BEOL layer 16. At FIG. 3C, cavities 38 are formed in the dielectric layer 36. The aluminum pads or interconnects 34 can be exposed through the cavities 38.

At FIG. 3D, a barrier layer 40 and/or a seed layer can be formed over the dielectric layer 36 and surfaces of the cavities 38. Copper 42 is provided at least in the cavities over the barrier layer 40. At FIG. 3D copper 42 is overfilled and excess copper 42 is present over the surface of the dielectric layer 36. The element 30 may be annealed at a temperature, for example, below 200° C., to at least partially stabilize the microstructure of copper 42, if needed. The excess copper 42 can be removed in FIG. 3E to form the copper pads 32. The excess copper 42 can be removed, for example, by way of polishing, such as chemical mechanical planarization (CMP). The polishing process can also remove portions of the barrier layer 40 from over the surface of the dielectric layer 36, and form a direct bonding surface of the element 30 after activation and/or termination as described above.

As shown in FIGS. 4A-4E, aluminum pads 44 can be formed in a similar manner as the method of forming the copper pads 32 shown in FIGS. 3A-3E. In place of the copper 42 provided in FIG. 3D, aluminum 46 can be provided in FIG. 4D, and excess aluminum 46 can be removed to form the aluminum pads 44. Alternatively, a blanket layer of aluminum can be deposited over the structure of FIG. 4A and patterned with an appropriate masking process and the unwanted portions of the aluminum subsequently etched (e.g., by reactive ion etch). For the alternative process, the dielectric bonding layer 36 is deposited over the patterned aluminum layer and polished back to the aluminum pads 44 to form a smooth dielectric bonding surface.

One disadvantage of the processes of FIGS. 3A-4E is the separate deposition of a bonding layer 36, which often entails exposing the elements to high temperature processing, and an expensive masking process to define the cavities 38. Moreover, for the process of FIGS. 4A-4E, the aluminum pads 44 are susceptible to oxidation, and a surface oxide may be formed over the aluminum pads 44. Also, the aluminum pads 44 are exposed to higher temperatures typically greater than 250° C. and usually 300° C. to 350° C. when the bonding layer 36 is deposited over the pre-patterned aluminum pads 44. The higher temperature dielectric process induces large grain formation in the aluminum pads 44. The subsequent dielectric planarization step forms a smooth dielectric bonding surface comprising surfaces of the aluminum pads 44 with the large grains. Metal pads with large grains (0.5 to 3 microns or larger) have fewer grain boundaries compared to metal pads with finer grains, for example less than 0.3 microns. In practice, pads with finer metal tend to bond at lower temperatures than pads with large grains. The susceptibility of aluminum to form thin surface aluminum oxide during planarization process and upon exposure to ambient air can be problematic during the direct bonding operation step. The surface oxide on the aluminum pads 44 impedes direct bonding of the aluminum pads 44 or 34 with corresponding aluminum pads of another element. Therefore, some treatment, such as argon sputtering may be employed to remove the surface oxide prior to bonding. However, such process may be time consuming and costly. Such process may also redeposit aluminum particles over portions of the dielectric bonding surface. One solution to avoid surface oxidation is to activate the surfaces of the aluminum pads 44 or 34 with nitrogen plasma. The exposure of the aluminum pads 44, 34 to nitrogen plasma causes aluminum nitride to be formed on the surfaces of the aluminum pads 44. While aluminum nitride at the surface is easier to deal with for direct bonding than aluminum oxide, such processes may call for a high temperature (e.g., 300° C. to 400° C.) bonding process in order to allow the surface aluminum nitride to decompose or for aluminum to diffuse through the surface nitride and form a metallurgical joint between pads 34, 44 of the opposing elements. The high temperature bonding process increases the thermal budget for forming a bonded structure. Various embodiments disclosed herein can achieve more simplified, cost-effective methods and structures for forming a bonded structure.

FIGS. 5A to 5F show a method of forming a bonding surface 76a of an element 76 according to an embodiment. FIG. 5A is a schematic cross-sectional side view showing an aluminum layer 60 over a back end of line (BEOL) layer 62, which is formed over devices (not shown) of the element, such as in or on a semiconductor material. A barrier layer 68 such as TiN, TiN/Ti, TiW or TiW/Ti, and/or a seed layer can be disposed between the BEOL layer 62 and the aluminum layer 60. The BEOL layer 62 can include a dielectric region 64 and an interconnect structure 66. The interconnect structure 66 can comprise an aluminum interconnect. The barrier layer 68 can be deposited over a surface of the BEOL layer 62, and the aluminum layer 60 can be deposited over the barrier layer 68. For example, the aluminum layer 60 can be provided by way of sputtering. For example, the aluminum layer 60 can be sputter deposited at about 150° C. or lower. The aluminum layer 60 can be relatively thin. For example, a thickness of the aluminum layer 60 can be in a range of 0.5 µm to 7 µm, 0.5 µm to 5 µm, 0.5 µm to 4 µm, 1 µm to 5 µm, 1 µm to 3 µm, or 1 µm to 2 µm depending at least in part on the circuit requirements.

In FIG. 5B, a selected or desired masking layer, such as a resist layer 70, can be provided over the aluminum layer 60 by lithographic methods. The resist layer 70 can be patterned over the aluminum layer 60 such that portions of the resist layer 70 are positioned over the interconnect structure 66.

In FIG. 5C, portions of the aluminum layer 60 can be selectively removed and form conductive features 72 by, for example, reactive ion etching (RIE) methods or by wet etch. For example, the portions of the aluminum layer 60 that are not covered by or free from the resist layer 70 can be etched using any suitable etching process, such as plasma etching, including reactive ion etching, to define the conductive features 72. The conductive feature 72 is an example of a conductive feature. The conductive features 72 can be conductive metal pads, vias or lines that include aluminum more than 50% by volume. For example, the conductive features 72 can comprise more than 80%, more than 90%, or more than 95% of aluminum by volume. In the illustrated embodiment, the conductive features 72 are patterned from the aluminum layer 60 and thus can be considered aluminum features, but in other embodiments the conductive features 72 may comprise one or more other metal layers, while still constituting singular features defined by a single mask and still comprising more than 50% aluminum by volume. Thus, each of the conductive features 72 may have continuous sidewalls characteristic of definition by a single mask process.

In FIG. 5D, a dielectric layer 74 can be provided over the conductive features 72 and over portions of the BEOL layer 62. In some embodiments, the dielectric layer 74 can comprise an oxide layer. For example, the oxide layer can be deposited at about 350° C. or other desirable temperatures by known methods. In some embodiments, multiple dielectric coating steps with other intermediary process(es) may be applied to form the dielectric layer 74. The dielectric coating may comprise a conformal coating (as shown) or nonconformal coating. In some embodiments, the dielectric layer 74 may comprise a combination of conformal and nonconformal dielectric coatings. The dielectric layer 74 can be referred to as a nonconductive field region. In some embodiments, the dielectric layer 74 is formed by sputtering, spin-on-deposition or other low temperature process.

As shown in FIG. 5E, portions of the dielectric layer 74 can be removed (e.g., polished) to expose surfaces of the conductive features 72. The surfaces of the conductive features 72 and surface of the remaining dielectric layer 74 can define the bonding surface 76a of the element 76. The bonding surface 76a of the element 76 can be polished using, for example, chemical mechanical polishing (CMP), as disclosed herein. Either the CMP chemistry or a subsequent selective etch can recess the surface of the conductive features 72 below the dielectric layer 74. The roughness of the polished bonding surface 76a can be less than 30 Å rms. For example, the roughness of the bonding surface 76a can be in a range of about 0.1 Å rms to 15 Å rms, 0.5 Å rms to 10 Å rms, or 1 Å rms to 5 Å rms. Additionally, the conductive features 72 and surrounding dielectric layer 74 can be formed during the back-end-of-line process, such that element 76 may be as supplied by an integrated circuit manufacturer, before or after singulation. A thickness of the conductive features 72 can be in a range of about 0.5 µm to 7 µm or 1 µm to 5 µm.

In FIG. 5F, the bonding surface 76a of the element 76 can be terminated. Although not shown, it will be understood that a protective layer can be provided and removed between polishing of FIG. 5E and the termination of FIG. 5F, similarly to that described below with respect to FIG. 6I. The bonding surface 76a of the element 76 can be terminated with, for example, fluorine to define a very thin layer of continuous or discontinuous surface aluminum fluoride (Al—F) complex, aluminum fluoride oxide (Al—F—O) complex, or aluminum fluoride boron oxide (Al—F—B—O) complex. In some embodiments, the bonding surface 76a can be rinsed by a rinsing solution that supplies the surface termination. For example, the rinsing solution can comprise 1-ethyl-3-methylimidazolium tetrafluoroborate, 1-butyl-3-methylimidazolium tetrafluoroborate, tetramethylammonium tetrafluoroborate, tetramethylammonium tetrafluoroborate, hydrogen fluoride (HF), or any suitable combination thereof. After termination, the bonding surface 76a can be spin dried, with or without a prior deionized water rinse. In some embodiments, the fluorine termination may be accomplished by way of a plasma process. For example, the surface of the conductive feature can be exposed to a gentle fluoride plasma or placed in a chamber where fluorine bearing gas such as carbon tetrafluoride ($CF_4$) has been used. The residual fluorine on the walls of the chamber can be adsorbed on the bonding surface 76a. The fluoride may reduce some of the native aluminum oxide. In some embodiments, the bonding surface 76a of the element 76 is not exposed to nitrogen plasma and/or ammonium dip before and after the fluorine treatment.

After the bonding surface 76a of the element 76 has been terminated, there can be gradient of fluorine concentration from the bonding surface 76a into the element 76. Thus, the element 76 can have a higher fluorine content at the bonding surface 76a than portions of the element 76 farther away from the surface. For example, there may be one or multiple fluorine peaks at or near the bonding surface 76a. In some embodiments, the conductive features 72 can have a gradient of fluorine concentration such that the surface of the conductive feature 72 has a higher fluorine content compared to deeper into the conductive feature. For example, the conductive feature 72 can have the highest fluorine concentration at the surface and the fluorine concentration gradually decreases from the surface of the conductive feature 72 to a portion of the conductive feature 72 farther away from the surface. In some embodiments, fluorine can be present about 4 nm to 6 nm (e.g., 5 nm) below the surface. In some embodiments, the level of oxygen present on the surface of the conductive feature 72 can very low or undetectable. For example, there may be less than 20 ppm of oxygen present on the surface of the conductive feature 72. In some embodiments, the bonding surface 76a can include a portion that is free from aluminum oxide. In some embodiments, very low or no carbon and/or nitrogen can be present in the conductive feature 72 and/or the dielectric layer 74. For example, there may be less than 50 ppm, 40 ppm, or 20 ppm of carbon or nitrogen present on the surface of the conductive feature 72 or the dielectric layer 74.

Without such termination, aluminum oxide ($Al_2O_3$) can be formed on the surfaces the conductive features 72 even upon room temperature exposure to air, including clean room air. Terminating the bonding surface 76a with fluoride can suppress or prevent aluminum oxide ($Al_2O_3$) formation on the surface of the conductive features 72. Table 1 below shows melting points and thermal expansion rates of aluminum (Al), aluminum oxide ($Al_2O_3$), aluminum nitride (AlN), and aluminum fluoride ($AlF_3$).

TABLE 1

| Materials | Melting point | Thermal Expansion |
|---|---|---|
| Al | 660° C. | 23 ppmK$^{-1}$ |
| $Al_2O_3$ | 2977° C. | 4.5 ppmK$^{-1}$ |
| AlN | 2200° C. | 5.3 ppmK$^{-1}$ |
| $AlF_3$ | 1250° C. | $\alpha_v$ - 86 ppmK$^{-1}$ |

Though aluminum has the lowest melting point among the four materials in Table 1 and the thermal expansion rate is relatively high, aluminum is susceptible to forming aluminum oxide at its surface with any air exposure. Aluminum oxide has a significantly higher melting point than the other three materials (about 4.5 times the melting point of aluminum) and has a significantly lower thermal expansion rate. Aluminum nitride has a lower melting point and a slightly higher thermal expansion rate than aluminum oxide. Nevertheless, the melting point of aluminum nitride is still significantly higher than aluminum and the thermal expansion rate of aluminum nitride is still significantly lower than aluminum. Aluminum fluoride has a comparatively lower melting point and a significantly high thermal expansion rate. Accordingly, terminating the surfaces of the conductive features 72 with fluorine can provide a reliable bonding surface (the bonding surface 76a) of the element 76 and facilitate lower anneal temperatures for forming the metal bonds during direct hybrid bonding. In some conditions, the fluorine terminated surface can mitigate or prevent oxide formation on the surface of the conductive features 72 for up to, for example, three days, four days, a week, or ten days.

The element 76 can be a wafer or a die, and the element 76 can be bonded to a second element (e.g., a wafer or a die). FIG. 5G is a schematic cross sectional side view of a bonded structure 2 that includes the element 76 in form of a wafer and a second element 80 (another wafer) bonded to the element 76 along a bond interface 82. In some embodiments, the second element 80 may be bonded to another substrate of interest. FIG. 5H is a schematic cross sectional side view of a bonded structure 2' that includes the element 76 in form of a wafer and a plurality of second elements 84 (dies) bonded to the element 76 along bond interfaces 86. The second elements 80 or 84 can include conductive features 92 and nonconductive field regions 94, and can have a similar structure to the first element 76 (including aluminum-based conductive features 92).

The bonding surface 76a of the element 76 can be directly bonded to bonding surface(s) 80a, 84a of the second element 80, 84 in any suitable manner disclosed herein. The bonding surface 76a of the element 76 can be directly bonded to bonding surface(s) 80a, 84a the second element(s) 80, 84 such that the nonconductive field region(s) 94 of the second element(s) 80, 84 are directly bonded to the dielectric layer 74 of the element 76 (which can be considered a first element in the embodiments of FIGS. 5H and 5G). This initial direct bond of the dielectric materials can form strong covalent bonds between the nonconductive field regions 94 of the opposing elements 76, 80, 84 at room temperature. In some embodiments, the second element 84 may be bonded to another substrate of interest.

The bonded elements 76 and 80, or 76 and 84 can then be heated (e.g., annealed) in order to cause the conductive features 72, 92 to expand across the gap left by the recessed aluminum, contact one another and form direct metal bonds. In some embodiments, the bonded elements 76 and 80, or 76 and 84 can be annealed at a temperature lower than 350° C., for example a temperature lower than or equal to about 300° C. or a temperature lower than or equal to about 250° C., for less than or equal to about 4 hours, such as between about 2.5 hours and 4 hours. For example, the annealing temperature can be in a range between about 150° C. and 300° C., between about 200° ° C. and 300° C., or between about 200° ° C. and 250° C. The annealing process can strengthen the bond between the conductive features 72 and the conductive features 92.

A fluorine content can be higher at the bonding surface 76a compared to deeper into the elements 76 and 80, 76 and 84. A gradient of fluorine concentration at or near the bonding surface 76a can be present in the bonded structure 2, 2'. For example, in the bonded structure 2, 2', there may be one or multiple fluorine peaks at or near a bond interface 82, 86 between the first and second elements 76 and 80, 76 and 84. In some embodiments, there is a very low or indetectable level of oxygen present between the conductive feature 72 and the conductive feature 92 after metal bonding. For example, there may be less than 1000 ppm, less than 500 ppm, or less than 100 ppm of oxygen present between the conductive feature 72 and the conductive feature 92 after bonding. Similarly, very low or no carbon and/or nitrogen associated with the terminating molecule or molecules can be present between the conductive feature 72 and the conductive feature 92 and/or between the dielectric layer 74 the nonconductive field region 94 after bonding. For example, there may be less than 100 ppm or less than 80 ppm of nitrogen and/or carbon present between the conductive feature 72 and the conductive feature 92 after bonding.

Figure 6E:
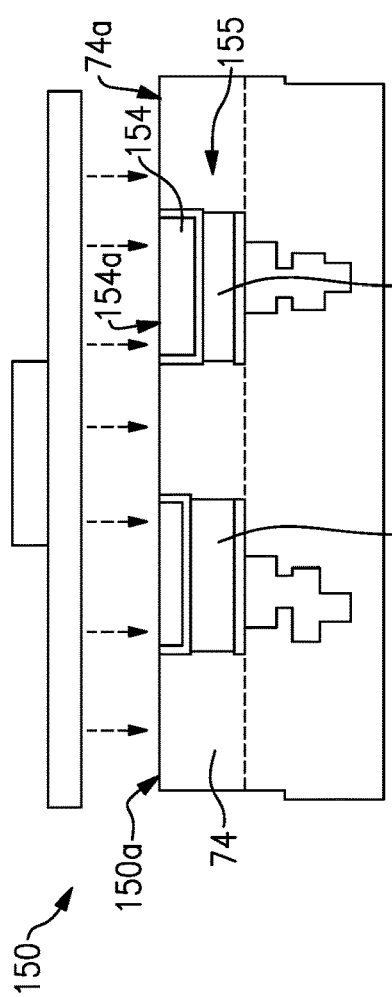

FIGS. 6A to 6E show a method of forming a bonding surface 150a of an element 150 according to an embodiment. FIG. 6A is a schematic cross-sectional side view showing an aluminum layer 73 comprising large aluminum metal grains or fine aluminum grains and a dielectric layer 74 formed over a back end of line (BEOL) layer 62 that includes an interconnect structure 66. The aluminum layer 73 and/or the dielectric layer 74 can be planar. The structure of FIG. 6A can be the same as or generally similar to the structure of FIG. 5E. As described above, the aluminum layer 73 and the dielectric layer 74 can also be part of the BEOL or a redistribution layer (RDL) structure of an integrated device.

In FIG. 6B, at least a portion of the aluminum layer 73 can be selectively removed to form a recess 152 over the aluminum layer 73, such as by RIE, wet etch, or other known methods. A depth of the recess can be in a range of 0.1 µm to 0.5 µm, 0.1 µm to 0.25 µm, or 0.15 µm to 0.2 µm. The portion of the aluminum layer 73 can be removed by way of, for example, dry etching (e.g., vapor or plasma etching) or wet etching.

In FIG. 6C, a barrier layer 153 and a fine grain aluminum layer 154 can be provided in the recess 152 and over the surface 74a of the dielectric layer 74. For example, the aluminum with fine grain microstructure may be formed over the recess 152 by sputtering and cooling the BEOL layer 62, or cooling a substrate (not shown) to which the BEOL layer 62 is bonded, below 100° C. and preferably below 50° C. or below, such as 20° ° C., during the sputtering. In some embodiments, the barrier layer 153 can completely or partially separate the fine grain aluminum layer 154 from the aluminum layer 73 and the dielectric layer 74. In some embodiments, the barrier layer 153 may be omitted, and the fine grain aluminum layer 154 can be coated directly over the larger grain aluminum 73. Fine grain aluminum can be defined as aluminum having an average grain dimension (e.g., width) less than 15 nm, less than 20 nm, less than 50 nm, less than 100 nm, less than 200 nm, less than 300 nm, or less than 500 nm. For example, the maximum width of grains in the fine grain aluminum layer 154 can be in a range of about 10 nm to 500 nm, about 10 nm to 300 nm, about 15 nm to 500 nm, about 15 nm to 300 nm, about 15 nm to 100 nm, about 15 nm to 50 nm, about 50 nm to 500 nm, about 50 nm to 300 nm, or about 100 nm to 300 nm. In some embodiments, most of the grains in the fine grain aluminum layer 154 can have a width in a range of about 10 nm to 500 nm, about 10 nm to 300 nm, about 15 nm to 500 nm, about 15 nm to 300 nm, about 15 nm to 100 nm, about 15 nm to 50 nm, about 50 nm to 500 nm, about 50 nm to 300 nm, or about 100 nm to 300 nm.

In some embodiments, the fine grain aluminum layer 154 can be provided by way of a low temperature deposition. For example, the fine grain aluminum layer 154 can be deposited at a temperature less than about 100° C., less than about 65° C., or less than about 20° C. For example, a deposition temperature for depositing the fine grain aluminum layer 154 can be in a range between about 10° C. and 100° C., about 10° C. and 65° ° C., about 10° C. and 50° C., or about 10° C. and 20° C. A thickness of the fine grain aluminum layer 154 can be the same as or thicker than the depth of the recess 152.

In FIG. 6D, portions of the barrier layer 153 and the fine grain aluminum layer 154 over the surface 74a of the dielectric layer 74 can be removed. For example, the portion of the barrier layer 153 and the fine grain aluminum layer 154 can be removed by way of polishing (e.g., chemical mechanical polishing (CMP)) to a degree sufficient to define the bonding surface 150a of the element 150 that includes the surface 74a of the dielectric layer 74 and a surface 154a of the fine grain aluminum layer 154. Either the CMP chemistry or a subsequent etch process can recess the aluminum surface 154a below the dielectric surface 74a. The CMP process can take place at a temperature lower than the deposition temperature for depositing the fine grain aluminum layer 154. The aluminum layer 73, the barrier layer 153, and the fine grain aluminum layer 154 can together define a conductive feature 155. As with the prior embodiment, the conductive features 155 may comprise more than 50% aluminum by volume, for example greater than 80% aluminum by volume, may have continuous sidewalls characteristic of definition by a single mask process. Where predominantly aluminum, as in the illustrated embodiment, the conductive feature 155 can be referred to as an aluminum feature, in some embodiments. The conductive feature 155 can have a first portion (e.g., the aluminum layer 73) and a second portion (e.g., the fine grain aluminum layer 154). The second portion can have a microstructure different from the first portion. A thickness of the conductive feature 155 can be in a range of about 0.5 µm to 7 µm or 1 µm to 5 µm.

In FIG. 6E, the bonding surface 150a of the element 150 can be terminated in the same or similar manner disclosed above with respect to FIG. 5F. The bonding surface 150a of the element 150 can be terminated with, for example, fluorine to define surface aluminum fluoride complex, aluminum fluoride oxide complex, or aluminum fluoride boron oxide complex. In some embodiments, the bonding surface 150a can be rinsed by a rinsing solution. For example, the rinsing solution can comprise 1-ethyl-3-methylimidazolium tetrafluoroborate, 1-butyl-3-methylimidazolium tetrafluoroborate, tetramethylammonium tetrafluoroborate, tetramethylammonium tetrafluoroborate, hydrogen fluoride (HF), buffered hydrogen fluoride (BHF), or any suitable combination thereof. The bonding surface 150a can be spin dried without rinsing with deionized (DI) water. In some embodiments, the treated surface may be rinsed with DI water or other suitable solvents and dried by known methods, for example, by spin drying. In some embodiments, the fluorine termination may be accomplished by way of a plasma process as described above.

The bonding surface 150a of the element 150 can be formed without a high temperature process. Therefore, the relatively small grain sizes of the fine grain aluminum layer 154 can be maintained, which can be advantageous for subsequent metal bonding.

Figure 6F:
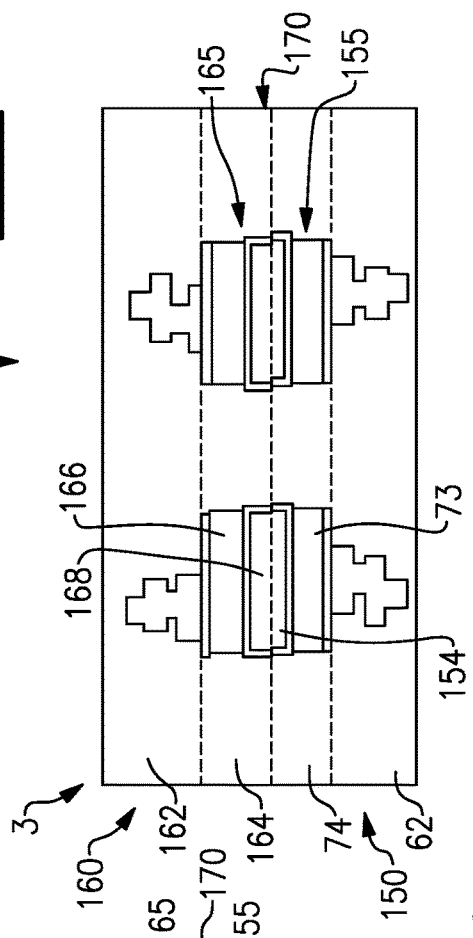
FIG. 6F is a schematic cross-sectional side view of a bonded structure that includes the element formed in FIG. 6E prior to annealing.

FIG. 6F is a schematic cross-sectional side view of a bonded structure 3 that includes the element 150 and a second element 160 bonded to the element 150. In some embodiments, the second element 160 can have the same or generally similar structure as the element 150. The second element 160 can include a BEOL layer 162 including interconnect features, a dielectric layer 164, and conductive features 165 that includes an aluminum layer 166 and a fine grain aluminum layer 168 that together can serve as a pad. The bonding surface 150a of the element 150 can be directly bonded to a bonding surface 160a of the second element 160 along a bond interface 170 such that the dielectric layer 74 is directly bonded to the dielectric layer 164. This initial direct bond of the dielectric materials can form strong covalent bonds between the dielectric layers 74, 164 of the opposing elements 150, 160 at room temperature. In some embodiments, the second element 160 may be bonded to another substrate of interest.

Figure 6G:
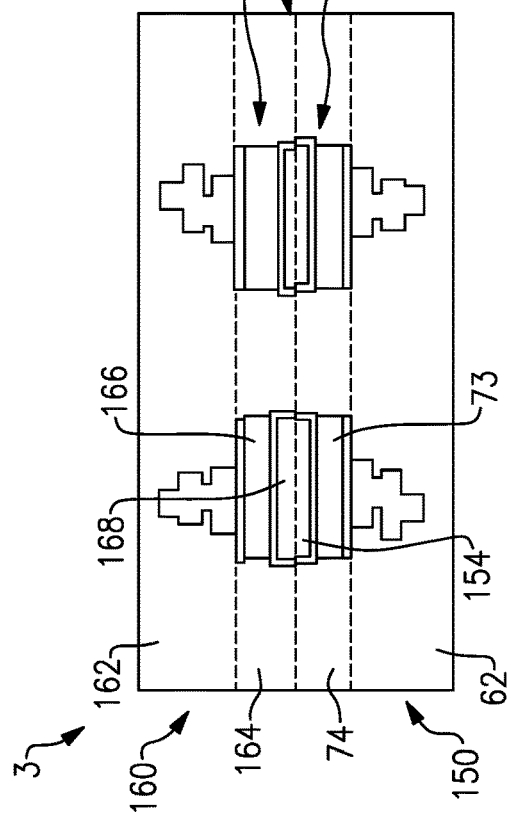
FIG. 6G is a schematic cross-sectional side view of a bonded structure that includes the element formed in FIG. 6F after annealing.

In FIG. 6G, the bonded structure 3 formed in FIG. 6F can be heated (e.g., annealed). In some embodiments, the structure formed in FIG. 6F can be annealed at a temperature lower than about 350° C., lower than about 300° C. or a temperature lower than about 250° C. for less than or equal to about 2 hours. For example, the annealing temperature can be in a range between about 150° C. and 300° C., between about 200° C. and 300° C., or between about 200° C. and 250° C. The annealing process can cause expansion of the fine grain aluminum layers 154, 168 across the gap left by the recessed aluminum surfaces and cause metal bonding between the fine grain aluminum layers 154, 168. Annealing can also strengthen the bond between the dielectric layers 74, 164. The grains of the fine grain aluminum layer 154 can grow due to the heating process. In some embodiments, the grains of the fine grain layer 154 can still be smaller than the grains of the aluminum layer 73. For example, an average grain dimension (e.g., width) of the grains in the fine grain aluminum layer 154 after annealing can be less than 1000 nm, 750 nm or 500 nm. For example, the maximum width of the largest grain in the fine grain aluminum layer 154 after annealing can be in a range of about 20 nm to 500 nm. In some embodiments, most of the grains in the fine grain aluminum layer 154 after annealing can have a width in a range of about 200 nm to 500 nm. In some embodiments, the fine grain aluminum layer 154 can be deposited only on one of the bonded substrates. In some embodiments, the fine grain aluminum layer 154 may comprise aluminum nanoparticles formed by physical vapor deposition (PVD) methods or atomic layer deposition (ALD) or other known methods.

Like the element 76, the element 150 can be a die or a wafer and the second element 160 can be a die or a wafer. Thus, the process for bonding the element 150 and the second element 160 can include wafer-to-wafer (W2W), die-to-die (D2D), or die-to-wafer (D2W) bonding processes. In some embodiments, the bonded structure 3 can include additional wafers, substrates, or dies stacked and bonded over the second element 160. The stacked elements can be electrically connected via, for example, various TSVs.

Figure 6H:
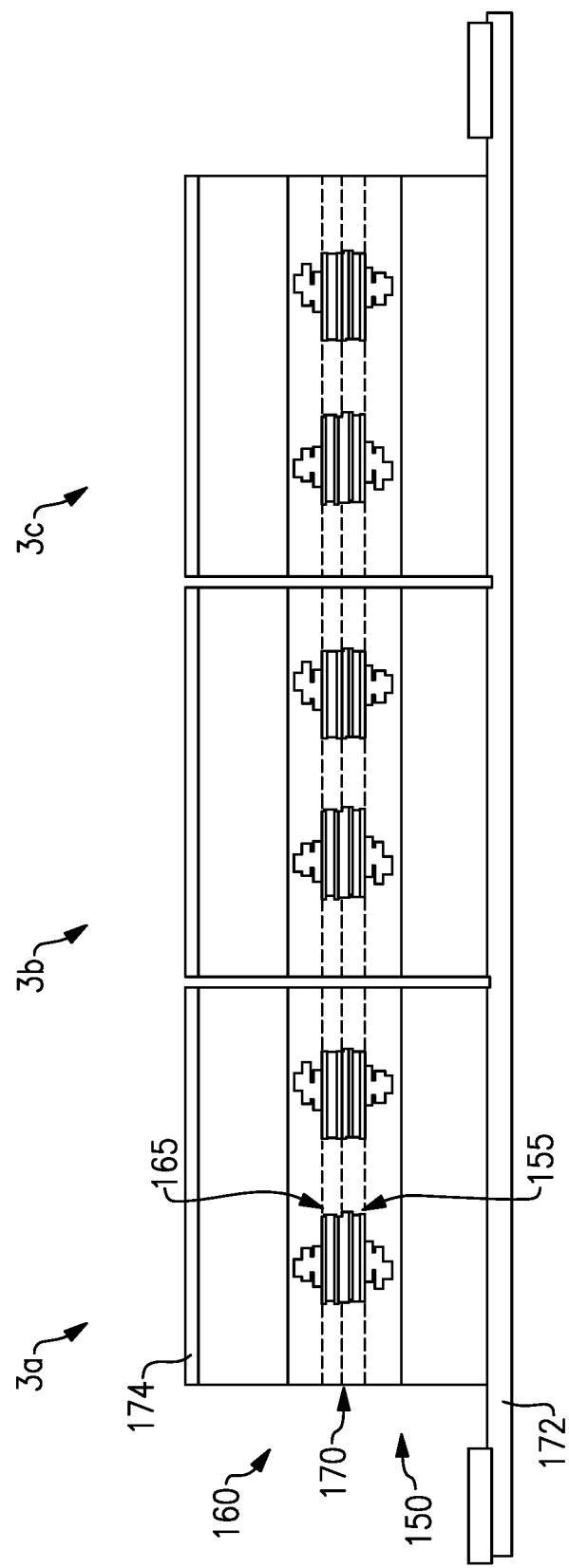
FIG. 6H is a schematic cross-sectional side view of a bonded structure that includes the element formed in FIG. 6F or 6G after singulation.

FIG. 6H is a cross-sectional side view of singulated bonded structures 3a, 3b, 3c. In some embodiments, the singulated bonded structures 3a, 3b, 3c can be formed by W2W bonding the element 150 and the second element 160 of FIG. 6F followed by a singulation process. For example, the singulation process can include attaching a bonded W2W structure to a dicing film or tape 172, forming a protective layer 174 on the bonded W2W structure, and singulating the bonded W2W structure into a plurality of singulated structures, such as the singulated bonded structures 3a, 3b, 3c. Each of the singulated bonded structures 3a, 3b, 3c can include a die from the element 150 and a die from the second element 160.

Figure 6I:
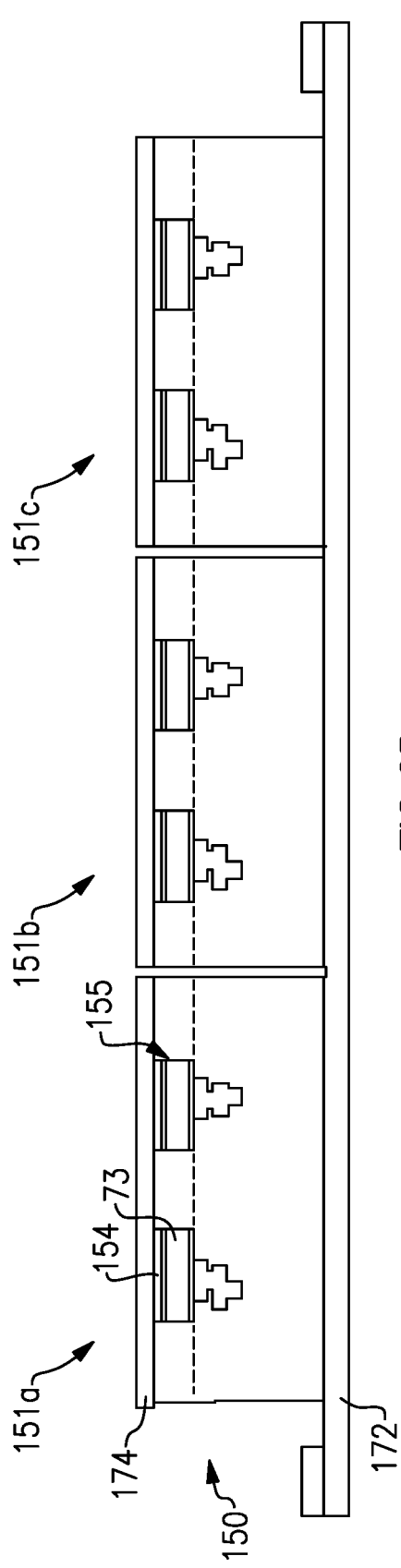
FIG. 6I is a schematic cross-sectional side view of the element of FIG. 6D or 6E after forming a protective layer and singulation.
Figure 6J:
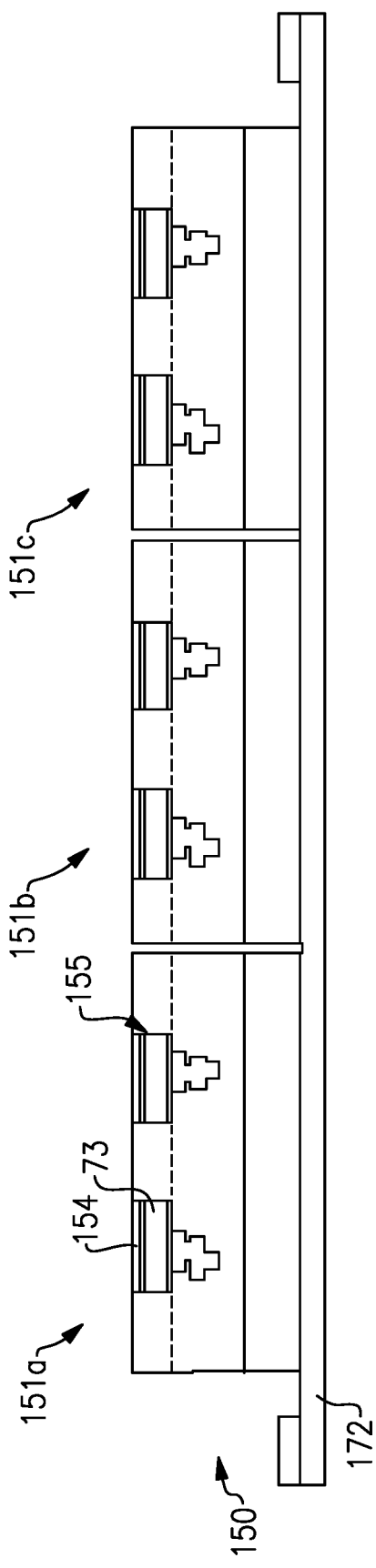
FIG. 6J is a schematic cross-sectional side view of the singulated elements of FIG. 6I after removing the protective layer.

FIG. 6I is a cross-sectional side view of singulated elements 151a, 151b, 151c after at least partial preparation for direct hybrid bonding but before actual bonding. In some embodiments, the element 150 shown in FIG. 6D can comprise a wafer from which the singulated elements 151a, 151b, 151c can be formed. For example, the element 150 in form of a wafer can be positioned on a dicing film or tape 172. A protective layer 174 can be formed on the element 150. The element 150 can be singulated into the singulated elements 151a, 151b, 151c. After singulation, the protective layer 174 can be removed as shown in FIG. 6J.

After removing the protective layer 174, as shown in FIG. 6K, bonding surfaces of the singulated elements 151a, 151b, 151c can be terminated as described with respect to FIG. 6F. After terminating the surfaces of the singulated elements 151a, 151b, 151c, the singulated elements 151a, 151b, 151c can be bonded to the second element 160 to thereby forming a D2W bonded structure 4, as shown in FIG. 6L. In the D2W bonded structure 4, the singulated elements 151a, 151b, 151c can be bonded to the second element 160 as described with respect to FIG. 6G.

Figure 7E:
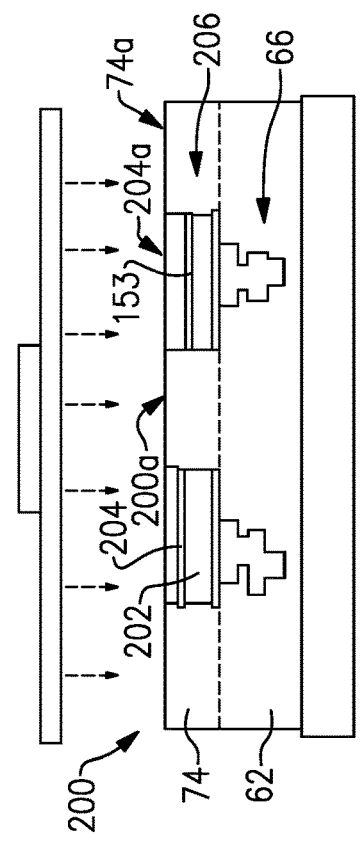

FIGS. 7A to 7E show a method of forming a bonding surface 200a of an element 200 according to an embodiment. FIG. 7A is a schematic cross-sectional side view showing aluminum layer 202 and dielectric layer 74 formed over a back end of line (BEOL) or RDL layer 62 that includes an interconnect structure 66. The structure of FIG. 7A can be the same as or generally similar to the structure of FIGS. 5E and 6A.

In FIG. 7B, at least a portion of the aluminum layer 202 can be removed to form a recess 152 over each aluminum layer 202. A depth of the recess can be in a range of 0.1 μm to 0.5 μm, 0.1 μm to 0.35 μm, or 0.15 μm to 0.25 μm. The portion of the aluminum layer 202 can be removed by way of, for example, dry etching (e.g., vapor or plasma etching) or wet etching.

In FIG. 7C, a barrier layer 153 and a different type of conductive material, such as the illustrated copper layer 204 can be provided in the recess 152 and over the surface 74a of the dielectric layer 74. The copper layer 204 is an example of the different type of conductive material and another example can include a silver layer. The copper layer 204 can comprise fine grain copper having an average grain width less than about 15 nm, less than about 20 nm, less than about 50 nm, less than about 100 nm, less than about 200 nm, less than about 300 nm, or less than about 500 nm. For example, the maximum width of grains in the copper layer 204 can be in a range of about 10 nm to 500 nm, about 10 nm to 300 nm, about 15 nm to 500 nm, about 15 nm to 300 nm, about 15 nm to 100 nm, about 15 nm to 50 nm, about 50 nm to 500 nm, about 50 nm to 300 nm, or about 100 nm to 300 nm. In some embodiments, most of the grains in the fine grain copper layer 204 can have a width in a range of about 10 nm to 500 nm, about 10 nm to 300 nm, about 15 nm to 500 nm, about 15 nm to 300 nm, about 15 nm to 100 nm, about 15 nm to 50 nm, about 50 nm to 500 nm, about 50 nm to 300 nm, or about 100 nm to 300 nm. In some embodiments, the different conductive layer may be coated by electroless or electroplating methods. Also, the different conductive layer may be coated by printing methods, or by physical vapor deposition (PVD) methods, such as evaporation or sputtering. In some embodiments, the different conductive layer may comprise nanoparticle copper, nanoparticle silver, or other nanoparticle metals. The nanoparticle metals may be coated by electroless or electrolytic or by low temperature sputtering, amongst other methods.

In some embodiments, the copper layer 204 can be provided by way of a low temperature deposition. For example, the copper layer 204 can be deposited at a temperature less than 100° C., less than 65° ° C., or less than 20° C. For example, a deposition temperature for depositing the copper layer 204 can be in a range between 1° C. and 10° C., 10° C. and 100° C., 10° C. and 65° C., 10° C. and 50° C., or 10° C. and 35° C. A thickness of the copper layer 204 can be the same as or generally similar to the depth of the recess 152. The copper layer 204 can be deposited by physical deposition (e.g., sputtered) rather than plated. By the nature of the deposition process, the copper layer 204 can have a mostly 111 texture, and a randomly oriented grain structure.

In FIG. 7D, portions of the barrier layer 153 and the copper layer 204 over the surface 74a of the dielectric layer 74 can be removed. For example, the portion of the barrier layer 153 and the copper layer 204 over the dielectric layer 74 can be removed by way of polishing (e.g., chemical mechanical polishing (CMP)) to define the bonding surface 200a of the element 200 that includes the surface 74a of the dielectric layer 74 and a surface 204a of the copper layer 204. In practice, the CMP process to form the dielectric bonding surface 200a may polish off very small portion of the dielectric material 74 in the barrier layer 153 removal step. The CMP process can take place at a temperature lower than the deposition temperature for depositing the copper layer 204. Either the CMP chemistry or a subsequent etch process can recess the copper surface 204a below the dielectric surface 74a. The aluminum layer 202 and the copper layer 204 can together form a conductive feature 206. Because the upper copper layer 204 and lower aluminum layer 202 have their sidewalls or lateral extents defined by the same mask (e.g., mask for etching either aluminum to form the aluminum layer 202 or for etching dielectric layer 74 for filling with aluminum), the sidewalls of the upper and lower portions are continuous, without discontinuities (e.g., corners) typical of misalignment when the upper and lower portions are defined by separate masks. At least the lower aluminum layer 202 comprises aluminum. In the illustrated embodiment, the copper layer 204 comprises copper or other conductive material (e.g., silver), though in other embodiments the upper portion can also comprise fine grain aluminum. The conductive feature 206 can have a first portion (e.g., the aluminum layer 73) and a second portion (e.g., the upper copper layer 204). The second portion can have a microstructure different from the first portion. A thickness of the conductive feature 206 can be in a range of about 0.5 µm to 7 µm or 1 µm to 5 µm.

In FIG. 7E, the bonding surface 200a of the element 200 can be cleaned and exposed to a plasma and/or etchants to activate the bonding surface 200a. In some embodiments, the bonding surface 200a of the element 200 can be terminated with a species after activation or during activation (e.g., during the plasma and/or etch processes). Without being limited by theory, in some embodiments, the activation process can be performed to break chemical bonds at the bonding surface 200a of the element 200, and the termination process can provide additional chemical species at the bonding surface 200a that improves the bonding energy during direct bonding. In some embodiments, the activation and termination are provided in the same step, e.g., a plasma to activate and terminate the bonding surface 200a of the element 200. In other embodiments, the bonding surface 200a of the element 200 can be terminated in a separate treatment to provide the additional species for direct bonding.

As explained above, the bonding surface 200a can include concentration of materials from the activation and/or last chemical treatment processes. For example, in embodiments that utilize a nitrogen plasma for activation, a nitrogen peak can be formed at the bonding surface 200a. The nitrogen peak can be detectable using secondary ion mass spectroscopy (SIMS) techniques.

In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen peak can be formed at the bonding surface 200a. In some embodiments, the bonding surface 200a can comprise silicon oxynitride, silicon oxycarbonitride, or silicon carbonitride.

Figure 7F:
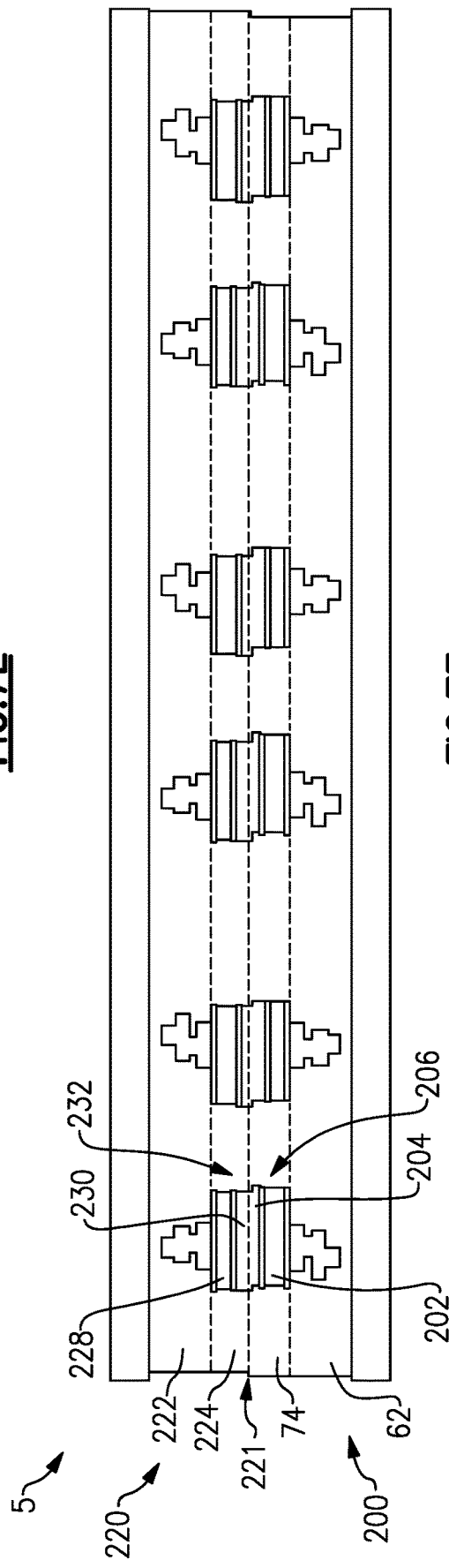
FIG. 7F is a schematic cross-sectional side view of a bonded structure that includes the element formed in FIG. 7E.

As with the elements 76, 150 of prior embodiments, the element 200 can be a die or a wafer, and the element 200 can be bonded to another element (e.g., a wafer or a die). FIG. 7F is a schematic cross sectional side view of a bonded structure 5 that includes the element 200 in form of a wafer and a second element 220 (another wafer) bonded to the element 200 along a bond interface 221. The second element 220 can comprise a BEOL layer 222, a dielectric layer 224, and a conductive feature 232 that can also include a lower portion 228 (e.g., aluminum) and an upper portion 230 (e.g., copper) as shown. The dielectric layer 74 and the dielectric layer 224 can be directly bonded to one another without an intervening adhesive, and the copper layer 204 and the upper layer 230 (e.g., copper layer) can be directly bonded to one another without an intervening adhesive. In other embodiments, additional wafers or substrates (e.g., 1 to 8 wafers) may be mechanically and electrically bonded over the second element 220. The bonded wafer or substrate stack may be singulated for subsequent processes. Similarly, additional dies (e.g., 1 to 40 dies) may be bonded or stacked over the second element 220. The wafer or substrate with bonded dies can be singulated for subsequent processing. One of the subsequent processes can comprise encapsulating the sides of the singulated stack in a dielectric layer. In some embodiments, the encapsulating dielectric layer comprises a molding material.

As with the element 150 illustrated in FIGS. 6I and 6J, the element 200 can be singulated into singulated elements prior to bonding, in some embodiments. The singulated elements can be bonded to another element (e.g., a wafer or a die) as described herein.

Various embodiments disclosed herein, or features thereof, can be combined to provide further embodiments. For example, any two or more elements disclosed herein can be bonded to define various bonded structures. For example, any two or more of the elements 76, 150, 200 can be bonded to define a bonded structure.

In the foregoing embodiments, aluminum-based features, such as contact pads, can be treated for efficient direct metal bonding, including direct hybrid bonding. In the illustrated embodiments, an aluminum feature can be defined and, without additional high temperature depositions or masking steps, treated for direct hybrid bonding. For example, unlike the process of FIGS. 3A-3D, no masking steps or insulating layer depositions are shown after the aluminum features are defined (e.g., at the stage of FIG. 5E). Consequently, in all of the illustrated embodiments, a metal contact feature prepared for direct hybrid bonding can have a continuous sidewall, characteristic of definition with a single masking process, with a lower aluminum portion and either an upper aluminum portion with fluorine treatment or an upper copper portion. In the embodiments of FIGS. 5A-5H, no depositions or masking steps are shown after definition of the aluminum feature at the surface, and fluorination facilitates low temperature direct hybrid bonding of the aluminum feature. The embodiments of FIGS. 6A-6L and 7A-7F can employ recessing and redeposition of metal to form different upper portions of the contact feature compared to lower portions (e.g., different aluminum grain structures or copper on top and aluminum on the bottom), but even these embodiments do not rely on additional insulator depositions or mask steps, such that the contact feature having a lower aluminum portion and a different metal upper portion still has a continuous sidewall characteristic of definition by a single masking process. Furthermore, the recessing, metal redeposition and CMP steps of FIGS. 6A-7F can all be performed at low temperatures compared to oxide deposition.

In one aspect, a method of forming a bonding surface for direct hybrid bonding is disclosed. The method can include providing an element having a nonconductive field region and an aluminum feature, and exposing a surface of the aluminum feature to fluorine. The surface of the aluminum feature and the surface of the nonconductive field region define the direct bonding surface.

In one embodiment, exposing the surface of the aluminum feature to fluorine suppresses aluminum oxide formation.

In one embodiment, the method further includes providing an aluminum layer over a back-end-of-line (BEOL) layer, removing at least a portion of the aluminum layer to define the aluminum feature, and providing a dielectric material proximate to the aluminum feature to define the nonconductive field region.

In one embodiment, the aluminum feature includes a first portion and a second portion over the first portion and at least partially defining the surface of the aluminum feature. The second portion can include an average grain size smaller than an average grain size of the first portion. The method can further include removing metal from an initial aluminum feature to leave the first portion below a recess of about 0.1 µm to 0.3 µm relative to the surface of the nonconductive field region, and depositing the second portion into the recess over the first portion. The second portion can have a microstructure different from the first portion. The second portion can be deposited at a deposition temperature below about 100° C. Most of the grains in the second portion can have a width in a range of 10 nm to 500 nm. The aluminum feature can have a continuous sidewall along a sidewall of the first portion and a sidewall of the second portion.

In one embodiment, a thickness of the aluminum feature is in a range of about 0.5 µm to 7 µm. The thickness of the aluminum feature can be in a range of about 1 µm to 5 µm.

In one embodiment, the element includes an aluminum interconnect structure electrically connected to the aluminum feature.

In one embodiment, exposing the surface of the aluminum feature to fluorine includes forming aluminum fluoride, aluminum fluoride oxide, or aluminum fluoride boron oxide. Exposing the surface of the aluminum feature to fluorine can include forming at least a portion that is free from aluminum oxide.

In one embodiment, exposing the surface of the aluminum feature to fluorine includes exposing the surface to a rinsing solution comprising 1-ethyl-3-methylimidazolium tetrafluoroborate, 1-butyl-3-methylimidazolium tetrafluoroborate, tetramethylammonium tetrafluoroborate, tetramethylammonium tetrafluoroborate, or hydrogen fluoride (HF).

In one embodiment, exposing the surface of the aluminum feature to fluorine without exposing the aluminum feature to nitrogen plasma or ammonium dip.

In one embodiment, a forming method of forming a bonded structure is disclosed. The forming method includes providing the element formed using the method, providing a second element having a second nonconductive field region and a conductive feature, directly bonding the nonconductive field region and the second nonconductive field region without an intervening adhesive, and directly bonding the aluminum feature and the conductive feature without an intervening adhesive.

In one aspect, a direct hybrid bonded structure is disclosed. The bonded structure can include a first element having a first nonconductive field region and a first aluminum feature. A surface of the first nonconductive field region and a surface of the first aluminum feature at least partially define a bonding surface of the first element. The bonded structure can include a second element having a second nonconductive field region and a second aluminum feature. A surface of the second nonconductive field region is directly bonded to the first nonconductive field region without an intervening adhesive along a bond interface and a surface of the second aluminum feature is directly bonded to the second aluminum feature without an intervening adhesive along the bond interface. The surface of the first aluminum feature includes a higher fluorine content than a portion of the first aluminum feature further away from the surface.

In one embodiment, the bond interface between the first and second aluminum features include one or multiple fluorine peaks.

In one embodiment, the first aluminum feature includes a first gradient of fluorine concentration decreasing away from the bond interface. The second aluminum feature can include a second gradient of fluorine concentration decreasing away from the bond interface.

In one embodiment, the first aluminum feature includes a first portion and a second portion over the first portion and at least partially defining the surface of the first aluminum feature. The second portion can include an average grain size smaller than an average grain size of the first portion. Most of the grains in the second portion can have a width in a range of 10 nm to 500 nm. The first aluminum feature can further include a barrier layer between the first and second portions.

In one embodiment, the bond interface between the first and second aluminum features includes less than 1000 ppm of oxygen.

In one embodiment, the bond interface between the first and second aluminum features includes less than 100 ppm of nitrogen.

In one embodiment, the first aluminum feature has a thickness in a range of 0.5 µm to 5 µm.

In one aspect, an element having a bonding surface configured to directly hybrid bond to another element is disclosed. The element can include a nonconductive field region, and an aluminum feature. A surface of the nonconductive field region and a surface of the aluminum feature together define the bonding surface of the element. The surface of the aluminum feature includes aluminum and fluorine.

In one embodiment, the aluminum feature has a thickness in a range of about 0.5 µm to 5 µm. The thickness of the aluminum feature can be in a range of about 1 µm to 3 µm.

In one embodiment, the aluminum feature includes a first portion and a second portion over the first portion. The second portion can define the surface of the aluminum feature. The second portion can include an average grain size smaller than an average grain size of the first portion. Most of the grains in the second portion can have a width in a range of 10 nm to 500 nm. A thickness of the second portion can be in a range of 0.1 µm to 0.3 µm.

In one embodiment, the surface of the aluminum feature is recessed from the surface of the nonconductive field region by about 2 nm to 20 nm.

In one aspect, a bonded structure is disclosed. The bonded structure can include a first element having a first nonconductive field region and a first conductive feature. A surface of the first nonconductive field region and a surface of the first conductive feature at least partially define a bonding surface of the first element. The first conductive feature includes a first portion and a second portion over the first portion and at least partially defines the surface of the first conductive feature. The first portion includes aluminum. The first conductive feature has a continuous sidewall along the first portion and the second portion. The second portion includes different metal composition from the first portion or includes fluorine at the surface of the first conductive feature. The bonded structure can include a second element having a second nonconductive field region and a second conductive feature. A surface of the second nonconductive field region that is directly bonded to the first nonconductive field region without an intervening adhesive along a bond interface and a surface of the second conductive feature that is directly bonded to the second conductive feature without an intervening adhesive along the bond interface.

In one embodiment, the second portion has an average grain size that is smaller than an average grain size of the second portion. Most of grains in the second portion can have a width in a range of 10 nm to 500 nm.

In one embodiment, the aluminum feature has a thickness in a range of 0.5 µm to 5 µm, and the second portion has a thickness in a range of 0.1 µm to 0.3 µm. The first and second portions can have different metal structures. The second portion can include aluminum. The surface of the conductive feature can include aluminum fluoride. The second portion can include copper.

In one aspect, an element having a bonding surface configured to directly bond to another element is disclosed. The element can include a nonconductive field region and a conductive feature that includes a first portion and a second portion over the first portion and at least partially defines a surface of the conductive feature. The first portion includes aluminum. The conductive feature has a continuous sidewall along the first portion and the second portion. The second portion includes different metal composition from the first portion or includes fluorine at the surface of the first conductive feature. A surface of the nonconductive field region and a surface of the aluminum feature together define the bonding surface of the element.

In one embodiment, the second portion has an average grain size that is smaller than an average grain size of the second portion. Most of grains in the second portion can have a width in a range of 10 nm to 500 nm.

In one embodiment, the aluminum feature has a thickness in a range of about 0.5 µm to 5 µm, and the second portion has a thickness in a range of about 0.1 µm to 0.3 µm. The second portion can include aluminum. The surface of the conductive feature can include aluminum fluoride. The second portion can include copper.

A method of forming an element having a bonding surface configured to directly bond to another element is disclosed. The method can include forming a nonconductive field region and a first portion of a conductive feature. The first portion comprising aluminum. The method can include forming a second portion of the conductive feature over the first portion. The second portion at least partially defines a surface of the conductive feature. The first and second portions are defined by a single masking process. The second portion includes a different metal composition from the first portion or includes fluorine at the surface of the first conductive feature. A surface of the nonconductive field region and a surface of the conductive feature together define the bonding surface of the element.

In one embodiment, the second portion includes fine grain aluminum.

In one embodiment, the second portion includes copper.

In one embodiment, the second portion includes aluminum and fluorine.

In one embodiment, the method further includes exposing the surface of the conductive feature to fluorine. Exposing the surface of the conductive feature to fluorine can suppress aluminum oxide formation. Exposing the surface of the aluminum feature to fluorine can be conducted without exposing the aluminum feature to nitrogen plasma or ammonium dip.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. For example, while illustrated embodiments include preparation for direct hybrid bonding, the skilled artisan will appreciate that the techniques taught herein can be useful for direct metal bonding even in the absence of direct dielectric bonding. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. It is also contemplated that various combinations or sub-combinations of the specific features and aspects of the embodiments may be made and still fall within the scope. The accompanying claims and their equivalents are intended to cover such forms or modifications as would fall within the scope and spirit of the disclosure.

What is claimed is:

1. A method of forming a bonding surface for direct hybrid bonding, the method comprising:
providing an element having a nonconductive field region and an aluminum feature; and
exposing a surface of the aluminum feature to fluorine, wherein the surface of the aluminum feature and a surface of the nonconductive field region at least partially define the direct bonding surface, wherein exposing the surface of the aluminum feature to fluorine comprises forming aluminum fluoride, aluminum fluoride oxide, or aluminum fluoride boron oxide.

2. The method of claim 1, wherein exposing the surface of the aluminum feature to fluorine suppresses aluminum oxide formation.

3. The method of claim 1, further comprising:
providing an aluminum layer over a back-end-of-line (BEOL) layer;
removing at least a portion of the aluminum layer to define the aluminum feature; and
providing a dielectric material proximate to the aluminum feature to define the nonconductive field region.

4. The method of claim 1, wherein the aluminum feature comprises a first portion and a second portion over the first portion and at least partially defining the surface of the aluminum feature, the second portion comprises an average grain size smaller than an average grain size of the first portion.

5. The method of claim 4, further comprising:
removing metal from an initial aluminum feature to leave the first portion below a recess of about 0.1 μm to 0.3 μm relative to the surface of the nonconductive field region; and
depositing the second portion into the recess over the first portion, the second portion having a microstructure different from the first portion.

6. The method of claim 5, wherein the second portion is deposited at a deposition temperature below about 100° C.

7. The method of claim 4, wherein the aluminum feature has a continuous sidewall along a sidewall of the first portion and a sidewall of the second portion.

8. The method of claim 1, wherein a thickness of the aluminum feature is in a range of about 0.5 μm to 7 μm.

9. The method of claim 1, wherein exposing the surface of the aluminum feature to fluorine comprises exposing the surface of the aluminum feature to a rinsing solution comprising 1-ethyl-3-methylimidazolium tetrafluoroborate, 1-butyl-3-methylimidazolium tetrafluoroborate, tetramethylammonium tetrafluoroborate, tetramethylammonium tetrafluoroborate, or hydrogen fluoride (HF).

10. A forming method of forming a bonded structure, the method comprising:
providing the element formed using the method of claim 1;
providing a second element having a second nonconductive field region and a conductive feature;
directly bonding the nonconductive field region and the second nonconductive field region without an intervening adhesive; and
directly bonding the aluminum feature and the conductive feature without an intervening adhesive.

11. A direct hybrid bonded structure comprising:
a first element having a first nonconductive field region and a first aluminum feature, a surface of the first nonconductive field region and a surface of the first aluminum feature at least partially defining a bonding surface of the first element; and
a second element having a second nonconductive field region and a second aluminum feature, a surface of the second nonconductive field region directly bonded to the first nonconductive field region without an intervening adhesive along a bond interface and a surface of the second aluminum feature directly bonded to the first aluminum feature without an intervening adhesive along the bond interface,
wherein the surface of the first aluminum feature comprises a higher fluorine content than a portion of the first aluminum feature further away from the surface.

12. The bonded structure of claim 11, wherein the bond interface between the first and second aluminum features comprise one or multiple fluorine peaks.

13. The bonded structure of claim 11, wherein the first aluminum feature comprises a first portion and a second portion over the first portion and at least partially defining the surface of the first aluminum feature, the second portion comprises an average grain size smaller than an average grain size of the first portion.

14. The bonded structure of claim 13, wherein most of the grains in the second portion have a width in a range of 10 nm to 500 nm.

15. The bonded structure of claim 11, wherein the bond interface between the first and second aluminum features comprises less than 1000 ppm of oxygen.

16. An element having a bonding surface configured to directly hybrid bond to another element, the element comprising:
a nonconductive field region; and
an aluminum feature, a surface of the nonconductive field region and a surface of the aluminum feature together at least partially defining the bonding surface of the element, the surface of the aluminum feature comprising aluminum and fluorine.

17. The element of claim 16, wherein the aluminum feature has a thickness in a range of about 0.5 μm to 5 μm.

18. The element of claim 16, wherein the aluminum feature comprises a first portion and a second portion over the first portion, the second portion defining the surface of the aluminum feature, the second portion comprises an average grain size smaller than an average grain size of the first portion, wherein most of the grains in the second portion have a width in a range of 10 nm to 500 nm.

19. The element of claim 18, wherein a thickness of the second portion is in a range of 0.1 μm to 0.3 μm.

20. The method of claim 2, wherein most of the grains in the second portion have a width in a range of 10 nm to 500 nm.

21. The method of claim 8, wherein the thickness of the aluminum feature is in a range of about 1 μm to 5 μm.

22. The method of claim 1, wherein the element includes an aluminum interconnect structure electrically connected to the aluminum feature.

23. The method of claim 1, wherein exposing the surface of the aluminum feature to fluorine comprises forming at least a portion that is free from aluminum oxide.

24. The method of claim 1, wherein exposing the surface of the aluminum feature to fluorine is conducted without exposing the aluminum feature to nitrogen plasma or ammonium dip.

25. The bonded structure of claim 11, wherein the first aluminum feature comprises a first gradient of fluorine concentration decreasing away from the bond interface.

26. The bonded structure of claim 25, wherein the second aluminum feature comprises a second gradient of fluorine concentration decreasing away from the bond interface.

27. The bonded structure of claim 13, wherein the first aluminum feature further comprises a barrier layer between the first and second portions.

28. The bonded structure of claim 11, wherein the bond interface between the first and second aluminum features comprises less than 100 ppm of nitrogen.

29. The bonded structure of claim 11, wherein the first aluminum feature has a thickness in a range of 0.5 µm to 5 µm.

30. The element of claim 29, wherein the thickness of the aluminum feature is in a range of about 1 µm to 3 µm.

31. The element of claim 16, wherein the surface of the aluminum feature is recessed from the surface of the nonconductive field region by about 2 nm to 20 nm.

32. A bonded structure comprising:
a first element having a first nonconductive field region and a first conductive feature, a surface of the first nonconductive field region and a surface of the first conductive feature at least partially defining a bonding surface of the first element, the first conductive feature including a first portion and a second portion over the first portion and at least partially defining the surface of the first conductive feature, the first portion comprising aluminum, the first conductive feature having a continuous sidewall along the first portion and the second portion, the second portion comprising different metal composition from the first portion or comprising fluorine at the surface of the first conductive feature; and
a second element having a second nonconductive field region and a second conductive feature, a surface of the second nonconductive field region directly bonded to the first nonconductive field region without an intervening adhesive along a bond interface and a surface of the second conductive feature directly bonded to the first conductive feature without an intervening adhesive along the bond interface.

33. The bonded structure of claim 32, wherein the second portion has an average grain size that is smaller than an average grain size of the first portion, most of grains in the second portion have a width in a range of 10 nm to 500 nm.

34. The bonded structure of claim 32, wherein the aluminum feature has a thickness in a range of 0.5 µm to 5 µm, and the second portion has a thickness in a range of 0.1 µm to 0.3 µm.

35. The bonded structure of claim 34, wherein the first and second portions have different metal structures.

36. The bonded structure of claim 34, wherein the second portion comprises aluminum.

37. The bonded structure of claim 36, wherein the surface of the conductive feature comprises aluminum fluoride.

38. The bonded structure of claim 34, wherein the second portion comprises copper.

39. An element having a bonding surface configured to directly bond to another element, the element comprising:
a nonconductive field region; and
a conductive feature including a first portion and a second portion over the first portion and at least partially defining a surface of the conductive feature, the first portion comprising aluminum, the conductive feature having a continuous sidewall along the first portion and the second portion, the second portion comprising different metal composition from the first portion or comprising fluorine at the surface of the first conductive feature, a surface of the nonconductive field region and a surface of the aluminum feature together at least paritally defining the bonding surface of the element.

40. The element of claim 39, wherein the second portion has an average grain size that is smaller than an average grain size of the second portion, most of grains in the second portion have a width in a range of 10 nm to 500 nm.

41. The element of claim 39, wherein the aluminum feature has a thickness in a range of about 0.5 µm to 5 µm, and the second portion has a thickness in a range of about 0.1 µm to 0.3 µm.

42. The element of claim 41, wherein the second portion comprises aluminum.

43. The element of claim 42, wherein the surface of the conductive feature comprises aluminum fluoride.

44. The element of claim 41, wherein the second portion comprises copper.

45. A method of forming an element having a bonding surface configured to directly bond to another element, the method comprising:
forming a nonconductive field region and a first portion of a conductive feature, the first portion comprising aluminum; and
forming a second portion of the conductive feature over the first portion, the second portion at least partially defining a surface of the conductive feature,
wherein the first and second portions are defined by a single masking process,
the second portion comprises a different metal composition from the first portion or comprises fluorine at the surface of the conductive feature, and
a surface of the nonconductive field region and a surface of the conductive feature together at least partially define the bonding surface of the element.

46. The method of claim 45, wherein the second portion comprises fine grain aluminum.

47. The method of claim 45, wherein the second portion comprises copper.

48. The method of claim 45, wherein the second portion comprises aluminum and fluorine.

49. The method of claim 45, further comprising exposing the surface of the conductive feature to fluorine.

50. The method of claim 49, wherein exposing the surface of the conductive feature to fluorine suppresses aluminum oxide formation.

51. The method of claim 49, wherein exposing the surface of the conductive feature to fluorine is conducted without exposing the conductive feature to nitrogen plasma or ammonium dip.

* * * * *

UNITED STATES PATENT AND TRADEMARK OFFICE
CERTIFICATE OF CORRECTION

| | |
|---|---|
| PATENT NO. | : 12,506,114 B2 |
| APPLICATION NO. | : 18/148332 |
| DATED | : December 23, 2025 |
| INVENTOR(S) | : Cyprian Emeka Uzoh |

Page 1 of 1

It is certified that error appears in the above-identified patent and that said Letters Patent is hereby corrected as shown below:

In the Claims

In Column 26, Claim 39, Lines 13-14 (Approx.), delete "at least paritally defining" and insert --at least partially defining--.

Signed and Sealed this
Third Day of February, 2026

John A. Squires
*Director of the United States Patent and Trademark Office*